(12) United States Patent
Isomura et al.

(10) Patent No.: US 10,230,065 B2
(45) Date of Patent: Mar. 12, 2019

(54) ORGANIC EL ELEMENT HAVING REFLECTIVE INTERFACE TRANSPORT LAYERS

(71) Applicant: Sharp Kabushiki Kaisha, Sakai, Osaka (JP)

(72) Inventors: Yoshiyuki Isomura, Sakai (JP); Katsuhiro Kikuchi, Sakai (JP); Shinichi Kawato, Sakai (JP); Hideki Uchida, Sakai (JP); Manabu Niboshi, Sakai (JP); Satoshi Inoue, Sakai (JP); Yuto Tsukamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/315,410

(22) PCT Filed: Jun. 3, 2015

(86) PCT No.: PCT/JP2015/066043
§ 371 (c)(1),
(2) Date: Dec. 1, 2016

(87) PCT Pub. No.: WO2015/186741
PCT Pub. Date: Dec. 10, 2015

(65) Prior Publication Data
US 2017/0098793 A1    Apr. 6, 2017

(30) Foreign Application Priority Data

Jun. 3, 2014 (JP) .................................. 2014-115173

(51) Int. Cl.
*H01L 51/00* (2006.01)
*H01L 51/50* (2006.01)
(Continued)

(52) U.S. Cl.
CPC .......... *H01L 51/504* (2013.01); *H01L 51/002* (2013.01); *H01L 51/0026* (2013.01);
(Continued)

(58) Field of Classification Search
CPC . H01L 51/504; H01L 51/002; H01L 51/0026; H01L 51/506; H01L 51/5064;
(Continued)

(56) References Cited

U.S. PATENT DOCUMENTS

| 6,998,789 | B2* | 2/2006 | Uchida | ................... B32B 27/00 313/504 |
| 7,045,953 | B2* | 5/2006 | Nakayama | .......... H01L 51/5048 313/504 |

(Continued)

FOREIGN PATENT DOCUMENTS

| JP | 2010-123512 A | 6/2010 |
| JP | 2012-204793 A | 10/2012 |

(Continued)

OTHER PUBLICATIONS

Official Communication issued in International Patent Application No. PCT/JP2015/066043, dated Sep. 1, 2015.

*Primary Examiner* — Ida M Soward
(74) *Attorney, Agent, or Firm* — Keating & Bennett, LLP

(57) ABSTRACT

In an organic EL element equipped with an anode, a cathode, a luminescent layer, and an electron transport layer, the cathode includes a reflecting electrode. The electron transport layer includes a doped electron transport layer to which an n-type dopant material is added and a non-doped electron transport layer to which an n-type dopant material is not added. A first reflection surface that reflects light from the luminescent layer is provided at an interface between the doped electron transport layer and the non-doped electron transport layer.

16 Claims, 27 Drawing Sheets

(51) Int. Cl.
*H01L 51/52* (2006.01)
*H01L 51/56* (2006.01)
*H01L 27/32* (2006.01)

(52) U.S. Cl.
CPC .......... *H01L 51/506* (2013.01); *H01L 51/508* (2013.01); *H01L 51/5064* (2013.01); *H01L 51/5076* (2013.01); *H01L 51/5218* (2013.01); *H01L 51/5271* (2013.01); *H01L 51/56* (2013.01); *H01L 27/322* (2013.01); *H01L 27/3211* (2013.01); *H01L 51/5012* (2013.01); *H01L 51/5052* (2013.01); *H01L 51/5056* (2013.01); *H01L 51/5068* (2013.01); *H01L 51/5084* (2013.01); *H01L 51/5265* (2013.01)

(58) Field of Classification Search
CPC ............... H01L 51/508; H01L 51/5076; H01L 51/5218; H01L 51/5271; H01L 51/56; H01L 51/5012; H01L 51/5052; H01L 51/5056; H01L 51/5068; H01L 51/5084
See application file for complete search history.

(56) References Cited

U.S. PATENT DOCUMENTS

| | | | | |
|---|---|---|---|---|
| 7,439,671 | B2* | 10/2008 | Ohshita | H01L 51/0003 313/504 |
| 8,330,351 | B2* | 12/2012 | Adamovich | H01L 51/5016 257/102 |
| 8,653,537 | B2* | 2/2014 | He | H01L 51/0062 257/40 |
| 8,785,002 | B1* | 7/2014 | Anzenbacher, Jr. | C07D 235/18 252/301.16 |
| 8,894,098 | B2* | 11/2014 | MacPherson | G07D 7/1205 283/85 |
| 9,070,888 | B2* | 6/2015 | Leem | H01L 51/442 |
| 9,166,184 | B2* | 10/2015 | Yang | H01L 51/56 |
| 9,224,966 | B2* | 12/2015 | Sim | H01L 51/5008 |
| 9,461,253 | B2* | 10/2016 | Shibata | H01L 51/0087 |
| 9,528,668 | B2* | 12/2016 | Kawahara | F21S 6/005 |
| 2006/0250076 | A1* | 11/2006 | Hofmann | H01L 51/002 313/504 |
| 2008/0286610 | A1* | 11/2008 | Deaton | H01L 51/5016 428/704 |
| 2009/0230845 | A1 | 9/2009 | Kuma et al. | |
| 2011/0215308 | A1* | 9/2011 | Im | H01L 51/006 257/40 |
| 2013/0001523 | A1* | 1/2013 | Chun | H01L 51/5096 257/40 |
| 2014/0239278 | A1* | 8/2014 | Park | H01L 51/442 257/40 |
| 2015/0076451 | A1* | 3/2015 | Dobbertin | H01L 51/504 257/40 |
| 2015/0155517 | A1* | 6/2015 | Lang | H01L 51/5084 257/40 |
| 2016/0035991 | A1* | 2/2016 | Yamae | H01L 51/5004 257/40 |
| 2016/0343793 | A1* | 11/2016 | Yamazaki | H01L 27/322 |

FOREIGN PATENT DOCUMENTS

| | | |
|---|---|---|
| WO | 2006/098188 A1 | 9/2006 |
| WO | 2010/058690 A1 | 5/2010 |

\* cited by examiner

ORGANIC EL ELEMENT HAVING REFLECTIVE INTERFACE TRANSPORT LAYERS

TECHNICAL FIELD

The present invention relates to an organic EL (electroluminescent) element and a method for producing the same.

BACKGROUND ART

In recent years, flat panel displays are used in various commodity products and fields, and thus flat panel displays are required to have a large size, high image quality and low power consumption.

Under the circumstances, organic EL display devices, which include an organic EL (electroluminescent) element that utilizes electro luminescence of an organic material, are attracting great attention as all-solid state flat panel displays that are excellent as having capability of low voltage operation, quick responsivity and light emission.

The above organic EL element is provided with an anode, a cathode, and a luminescent layer formed between the anode and the cathode. In such an organic EL element, in order to enhance luminescence efficiency in the luminescent layer, a hole injection layer or a hole transport layer is provided between the anode and the luminescent layer, or an electron injection layer or an electron transport layer is provided between the cathode and the luminescent layer.

Further, it has been proposed that the above organic EL element is configured to emit light having a plurality of peaks.

Specifically, in a conventional organic EL element, as described in Patent Document 1 below for example, a plurality of luminescent layers are provided to emit light having a plurality of peaks. Further, in the conventional organic EL element, an electron supply layer made of a high electron mobility compound is provided between the cathode and the luminescent layer to adjust the carrier balance between holes and electrons in the respective luminescent layers.

PRIOR ART DOCUMENTS

Patent Documents

Patent Document 1: JP 2012-204793 A

DISCLOSURE OF INVENTION

Problem to be Solved by the Invention

However, in the conventional organic EL element such as that described above, the luminescence property deteriorates. Specifically, in the conventional organic EL element, since it is necessary to adjust the luminescence balance between the luminescent layers, the adjustment of the carrier balance becomes complicated, and the balance of colors changes as the luminescence time increases. This deteriorates the luminescence property.

Further, in the conventional organic EL element, the production process and the structure become complicated. Specifically, in the conventional organic EL element, since a plurality of luminescent layers are laminated, the production process becomes complicated and the margin decreases. Further, since a voltage to be applied increases, the power consumption increases.

With the foregoing in mind, it is an object of the present invention to provide an organic EL element having a simple structure that is produced easily and that has an excellent luminescence property while emitting light having a plurality of peaks, and a method for producing the same.

Means for Solving Problem

In order to achieve the above object, an organic EL element according to the present invention includes an anode, a cathode, a luminescent layer provided between the anode and the cathode, a hole transport layer provided between the anode and the luminescent layer, and an electron transport layer provided between the cathode and the luminescent layer, wherein one of the anode and the cathode is composed of a reflecting electrode, at least one of the hole transport layer and the electron transport layer is composed of a doped layer to which a dopant material is added and a non-doped layer to which a dopant material is not added, and a reflection surface that reflects light from the luminescent layer is provided at an interface between the doped layer and the non-doped layer.

In the thus configured organic EL element, one of the anode and the cathode is composed of a reflecting electrode. Further, at least one of the hole transport layer and the electron transport layer is composed of a doped layer to which a dopant material is added and a non-doped layer to which a dopant material is not added. Further, a reflection surface that reflects light from the luminescent layer is provided at an interface between the doped layer and the non-doped layer. Thus, unlike the above configuration example, it is possible to configure an organic EL element having a simple structure that is produced easily and that has an excellent luminescence property while emitting light having a plurality of peaks.

Further, the above organic EL element may be configured so that: the luminescent layer is composed of luminescent layers of a plurality of colors; among the luminescent layers of a plurality of colors, adjacent luminescent layers of different colors are formed integrally; and in at least one of the hole transport layer and the electron transport layer, a doped layer to which a dopant material is added and a non-doped layer to which a dopant material is not added are formed correspondingly to the integrally formed adjacent luminescent layers of different colors.

In this case, the adjacent luminescent layers of different colors can be formed using the same mask, and in at least one of the hole transport layer and the electron transport layer, the doped layer and the non-doped layer can be formed using the same mask. As a result, in the luminescent layer and in at least one of the hole transport layer and the electron transport layer, the positioning accuracy of RGB is improved easily.

Further, the above organic EL element may be configured so that: the electron transport layer is composed of a doped electron transport layer to which an n-type dopant material is added and a non-doped electron transport layer to which an n-type dopant material is not added; and a first reflection surface as the reflection surface is provided at an interface between the doped electron transport layer and the non-doped electron transport layer.

In this case, by the first reflection surface, it is possible to emit light having a plurality of peaks without providing a plurality of luminescent layers.

Further, the above organic EL element may be configured so that: the hole transport layer is composed of a doped hole transport layer to which a p-type dopant material is added and a non-doped hole transport layer to which a p-type dopant material is not added; and a second reflection surface as the reflection surface is provided at an interface between the doped hole transport layer and the non-doped hole transport layer.

In this case, by the second reflection surface, it is possible to emit light having a plurality of peaks without providing a plurality of luminescent layers.

Further, the above organic EL element may be configured so that: the cathode is composed of a reflecting electrode; and light from the luminescent layer is emitted from the anode side to the outside.

In this case, it is possible to configure a bottom emission type organic EL element having a simple structure that is produced easily and that has an excellent luminescence property while emitting light having a plurality of peaks.

Further, the above organic EL element may be configured so that: the anode is composed of a reflecting electrode, and light from the luminescent layer is emitted from the cathode side to the outside.

In this case, it is possible to configure a top emission type organic EL element having a simple structure that is produced easily and that has an excellent luminescence property while emitting light having a plurality of peaks.

Further, in the above organic EL element, a color filter may be provided on the anode or cathode side of the luminescent layer.

In this case, the color filter can adjust the wavelength region of light emitted to the outside.

A method for producing an organic EL element of the present invention that includes an anode, a cathode, a luminescent layer provided between the anode and the cathode, a hole transport layer provided between the anode and the luminescent layer, and an electron transport layer provided between the cathode and the luminescent layer, includes: forming a non-doped electron transport layer to which an n-type dopant material is not added and a doped electron transport layer to which an n-type dopant material is added, as the electron transport layer; and heating the organic EL element.

In the production method of the thus configured organic EL element, a non-doped electron transport layer to which an n-type dopant material is not added and a doped electron transport layer to which an n-type dopant material is added are formed as the electron transport layer. Further, since the step of heating the organic EL element is performed, the n-type dopant material added in the doped electron transport layer can be gathered at the interface between the non-doped electron transport layer and the doped electron transport layer, and thereby the reflection surface that reflects light from the luminescent layer can be formed at the interface. Thus, unlike the conventional example, it is possible to configure an organic EL element having a simple structure that is produced easily and that has an excellent luminescence property while emitting light having a plurality of peaks.

Further, in the production method of the organic EL element, it is preferred that, in the heating of the organic EL element, a reflection surface that reflects light from the luminescent layer be formed at an interface between the non-doped electron transport layer and the doped electron transport layer.

In this case, unlike the conventional example, since the reflection surface is formed at the interface between the non-doped electron transport layer and the doped electron transport layer, it is possible to configure an organic EL element having a simple structure that is produced easily and that has an excellent luminescence property while emitting light having a plurality of peaks.

The above production method of the organic EL element may further include forming luminescent layers of a plurality of colors, wherein, in the formation of luminescent layers of a plurality of colors, adjacent luminescent layers of different colors are formed integrally, and in the formation of the non-doped electron transport layer and the doped electron transport layer, the non-doped electron transport layer and the doped electron transport layer are formed correspondingly to the integrally formed adjacent luminescent layers of different colors.

In this case, the adjacent luminescent layers of different colors can be formed using the same mask, and in the electron transport layer, the doped layer and the non-doped layer can be formed using the same mask. As a result, in the luminescent layer and in the electron transport layer, the positioning accuracy of RGB is improved easily.

Further, a method for producing an organic EL element of the present invention that includes an anode, a cathode, a luminescent layer provided between the anode and the cathode, a hole transport layer provided between the anode and the luminescent layer, and an electron transport layer provided between the cathode and the luminescent layer, includes: forming a non-doped hole transport layer to which a p-type dopant material is not added and a doped hole transport layer to which a p-type dopant material is added, as the hole transport layer; and heating the organic EL element.

In the production method of the thus configured organic EL element, a non-doped hole transport layer to which a p-type dopant material is not added and a doped hole transport layer to which a p-type dopant material is added are formed as the hole transport layer. Further, since the step of heating the organic EL element is performed, the p-type dopant material added in the doped hole transport layer can be gathered at the interface between the non-doped hole transport layer and the doped hole transport layer, and thereby the reflection surface that reflects light from the luminescent layer can be formed at the interface. Thus, unlike the conventional example, it is possible to configure an organic EL element having a simple structure that is produced easily and that has an excellent luminescence property while emitting light having a plurality of peaks.

Further, in the production method of the organic EL element, it is preferred that, in the heating of the organic EL element, a reflection surface that reflects light from the luminescent layer be formed at an interface between the non-doped hole transport layer and the doped hole transport layer.

In this case, unlike the conventional example, since the reflection surface is formed at the interface between the non-doped hole transport layer and the doped hole transport layer, it is possible to configure an organic EL element having a simple structure that is produced easily and that has an excellent luminescence property while emitting light having a plurality of peaks.

The above production method of the organic EL element may further include forming luminescent layers of a plurality of colors, wherein, in the formation of luminescent layers of a plurality of colors, adjacent luminescent layers of different colors are formed integrally, and in the formation of the non-doped hole transport layer and the doped hole transport layer, the non-doped hole transport layer and the doped hole transport layer are formed correspondingly to the integrally formed adjacent luminescent layers of different colors.

In this case, the adjacent luminescent layers of different colors can be formed using the same mask, and in the hole transport layer, the doped layer and the non-doped layer can be formed using the same mask. As a result, in the luminescent layer and in the hole transport layer, the positioning accuracy of RGB is improved easily.

Further, a method for producing an organic EL element of the present invention that includes an anode, a cathode, a luminescent layer provided between the anode and the cathode, a hole transport layer provided between the anode and the luminescent layer, and an electron transport layer provided between the cathode and the luminescent layer, includes: forming a non-doped hole transport layer to which a p-type dopant material is not added and a doped hole transport layer to which a p-type dopant material is added, as the hole transport layer; forming a non-doped electron transport layer to which an n-type dopant material is not added and a doped electron transport layer to which an n-type dopant material is added, as the electron transport layer; and heating the organic EL element.

In the production method of the thus configured organic EL element, a non-doped electron transport layer to which an n-type dopant material is not added and a doped electron transport layer to which an n-type dopant material is added are formed as the electron transport layer. Further, a non-doped hole transport layer to which a p-type dopant material is not added and a doped hole transport layer to which a p-type dopant material is added are formed as the hole transport layer. Further, since the step of heating the organic EL element is performed, the n-type dopant material added in the doped electron transport layer can be gathered at the interface between the non-doped electron transport layer and the doped electron transport layer, and thereby the first reflection surface that reflects light from the luminescent layer can be formed at the interface. Also, the p-type dopant material added in the doped hole transport layer can be gathered at the interface between the non-doped hole transport layer and the doped hole transport layer, and thereby the second reflection surface that reflects light from the luminescent layer can be formed at the interface. Thus, unlike the conventional example, it is possible to configure an organic EL element having a simple structure that is produced easily and that has an excellent luminescence property while emitting light having a plurality of peaks.

Further, in the production method of the organic EL element, it is preferred that, in the heating of the organic EL element, a first reflection surface that reflects light from the luminescent layer be formed at an interface between the non-doped electron transport layer and the doped electron transport layer, and a second reflection surface that reflects light from the luminescent layer be formed at an interface between the non-doped hole transport layer and the doped hole transport layer.

In this case, unlike the conventional example, since the first reflection surface is formed at the interface between the non-doped electron transport layer and the doped electron transport layer and the second reflection surface is formed at the interface between the non-doped hole transport layer and the doped hole transport layer, it is possible to configure an organic EL element having a simple structure that is produced easily and that has an excellent luminescence property while emitting light having a plurality of peaks.

The above production method of the organic EL element may further include forming luminescent layers of a plurality of colors, wherein, in the formation of luminescent layers of a plurality of colors, adjacent luminescent layers of different colors are formed integrally, and in the formation of the non-doped hole transport layer and the doped hole transport layer and in the formation of the non-doped electron transport layer and the doped electron transport layer, the non-doped hole transport layer and the doped hole transport layer as well as the non-doped electron transport layer and the doped electron transport layer are formed correspondingly to the integrally formed adjacent luminescent layers of different colors.

In this case, the adjacent luminescent layers of different colors can be formed using the same mask, and in the hole transport layer and the electron transport layer, the doped layer and the non-doped layer can be formed using the same mask. As a result, in the luminescent layer and in the hole transport layer and the electron transport layer, the positioning accuracy of RGB is improved easily.

Further, in the above production method of the organic EL element, it is preferred that the doped electron transport layer be formed by a codeposition method using a host material and a dopant material.

In this case, it is possible to form the doped electron transport layer easily.

Further, in the above production method of the organic EL element, it is preferred that the doped hole transport layer be formed by a codeposition method using a host material and a dopant material.

In this case, it is possible to form the doped hole transport layer easily.

Effects of the Invention

According to the present invention, it is possible to provide an organic EL element having a simple structure that is produced easily and that has an excellent luminescence property while emitting light having a plurality of peaks, and a method for producing the same.

DESCRIPTION OF THE INVENTION

Figure 1:
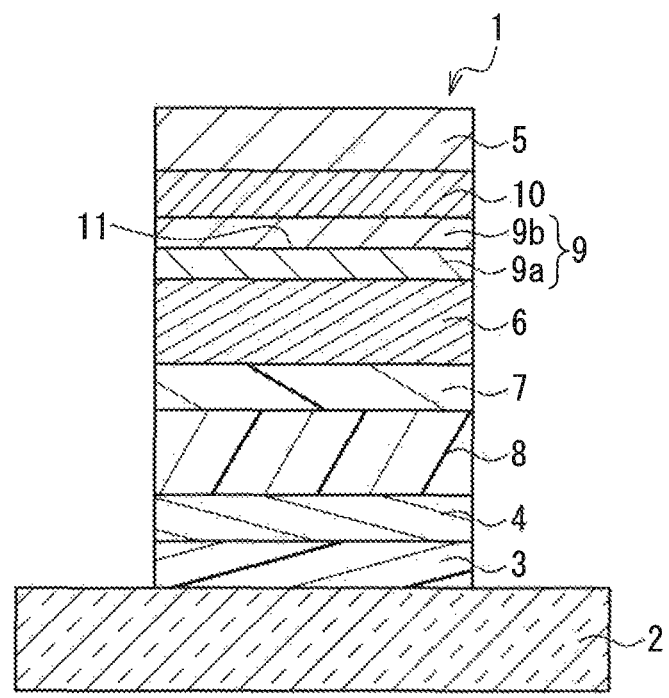
FIG. 1 is a cross-sectional view showing the configuration of an organic EL element according to Embodiment 1 of the present invention.

Hereinafter, preferred embodiments referring to an organic EL element of the present invention and a method for producing the same will be described with reference to attached drawings. In the descriptions below, the present invention is applied to an organic EL element having a red luminescent layer. The dimensions of constituent members and the dimensional proportions of the members in the drawings are not intended to faithfully represent the actual dimensions of the constituent members and the dimensional proportions of the members.

Embodiment 1

FIG. 1 is a cross-sectional view showing the configuration of an organic EL element according to Embodiment 1 of the present invention. In FIG. 1, an organic EL element 1 of this embodiment includes a substrate 2, a color filter 3 provided on the substrate 2, an anode 4 provided on the color filter 3, and a cathode 5 provided above the anode 4. In the organic EL element 1, a luminescent layer 6 that emits light of, e.g., red color is provided between the anode 4 and the cathode 5.

In the organic EL element 1 of this embodiment, a hole transport layer 7 and a hole injection layer 8 are provided between the anode 4 and the luminescent layer 6 in this order from the luminescent layer 6 side toward the anode 4 side. Further, in the organic EL element 1, an electron transport layer 9 and an electron injection layer 10 are provided between the cathode 5 and the luminescent layer 6 in this order from the luminescent layer 6 side toward the cathode 5 side.

Further, in the organic EL element 1 of this embodiment, as described later, the electron transport layer 9 includes a non-doped electron transport layer 9a to which an n-type dopant material (guest compound) is not added and a doped electron transport layer 9b to which an n-type dopant material is added. Further, in the organic EL element 1 of this embodiment, a first reflection surface 11 is provided at an interface between the non-doped electron transport layer 9a and the doped electron transport layer 9b, as a reflection surface to reflect light from the luminescent layer 6.

The substrate 2 is made of a material such as a glass. As described later, the color filter 3 is appropriately made of a material that adjusts the wavelength region of light emitted from the organic EL element 1 of this embodiment to the outside.

The anode 4 is made of, e.g., a transparent electrode material such as ITO or IZO, or a metal film such as a silver film. The thickness of the anode 4 is, e.g., about several nm to 300 nm.

The cathode 5 is made of a metal such as aluminum, magnesium, or silver. The cathode 5 constitutes a reflecting electrode. In other words, the organic EL element 1 of this embodiment is a bottom emission type that emits light from the luminescent layer 6 from the anode 4 (the substrate 2) side to the outside. The thickness of the cathode 5 is, e.g., about 20 nm to 200 nm.

The luminescent layer 6 is a recombination layer (active layer) that allows electrons and holes to recombine, and includes at least a host material and a luminescent dopant material. In the luminescent layer 6, for example, as the luminescent dopant material, both a fluorescent dopant material and a phosphorescent dopant material can be used. The thickness of the luminescent layer 6 is, e.g., about 40 nm.

The hole transport layer 7 is made of e.g., a material that is contained in a general organic EL element. An example thereof is 4,4'-bis[N-(1-naphthyl)-N-phenyl-amino]-biphenyl (α-NPD). The thickness of the hole transport layer 7 is, e.g., about 15 nm.

The hole injection layer 8 is made of e.g., a phthalocyanine-based material, star-burst polyamines, or polyanilines. The thickness of the hole injection layer 8 is, e.g., several ten nm.

For the electron transport layer 9, for example, Bphen is used as a host material. As described above, the electron transport layer 9 is composed of the non-doped electron transport layer 9a and the doped electron transport layer 9b. Examples of the n-type dopant material in the doped electron transport layer 9b include cesium carbonate ($Cs_2CO_3$), simple substances such as cesium, potassium and calcium, and compounds of these. Any of the dopant materials is added to the above host material (doping). The thickness of the electron transport layer 9 is, e.g., 20 nm.

The electron injection layer 10 is made of, e.g., metallic lithium, metallic barium, or a compound of these such as lithium fluoride. In many cases, the thickness of the electron injection layer 10 is very thin (e.g., 1 nm).

The first reflection surface 11 is formed at an interface between the non-doped electron transport layer 9a and the doped electron transport layer 9b by gathering at the interface the n-type dopant material added in the doped electron transport layer 9b. The first reflection surface 11 reflects a certain wavelength region of light from the luminescent layer 6 to the anode 4 side while transmitting a different wavelength region of light from the luminescent layer 6 to the cathode 5 side. Thus, the organic EL element 1 of this embodiment can emit light having a plurality of peaks.

Here, the action of the organic EL element 1 of this embodiment will be specifically described with reference to FIG. 2.

Figure 2:
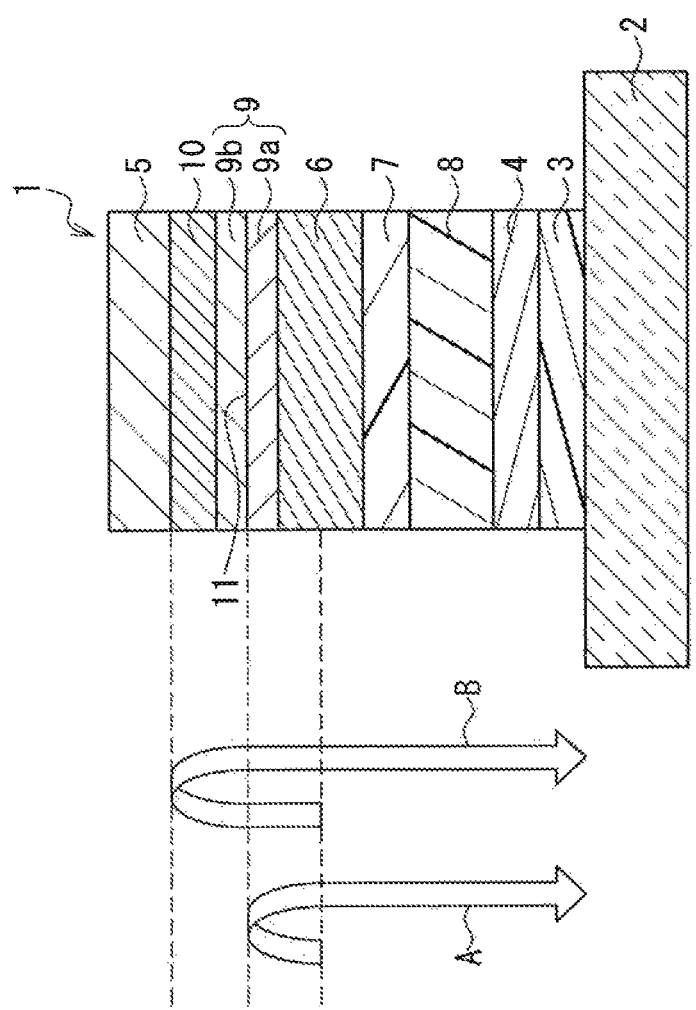
FIG. 2 is a view illustrating of the action of the organic EL element.

FIG. 2 is a view illustrating of the action of the organic EL element.

As shown in FIG. 2, in the organic EL element 1 of this embodiment, part of light from the luminescent layer 6 is reflected to the anode 4 side at the first reflection surface 11 and emitted to the outside as indicated by an arrow A in FIG. 2.

Further, as indicated by an arrow B in FIG. 2, part of light from the luminescent layer 6 passes through the first reflection surface 11, and is reflected to the anode 4 side at an interface between the cathode 5 and the electron injection layer 10 and emitted to the outside. This light has a peak different from that of light indicated by the arrow A in FIG. 2.

Thus, the organic EL element 1 of this embodiment can emit light having at least two peaks to the outside.

Next, a case where red sub-pixels of an active matrix organic EL display device are constituted using the organic EL element 1 of this embodiment will be specifically described with reference to FIG. 3.

Figure 3:
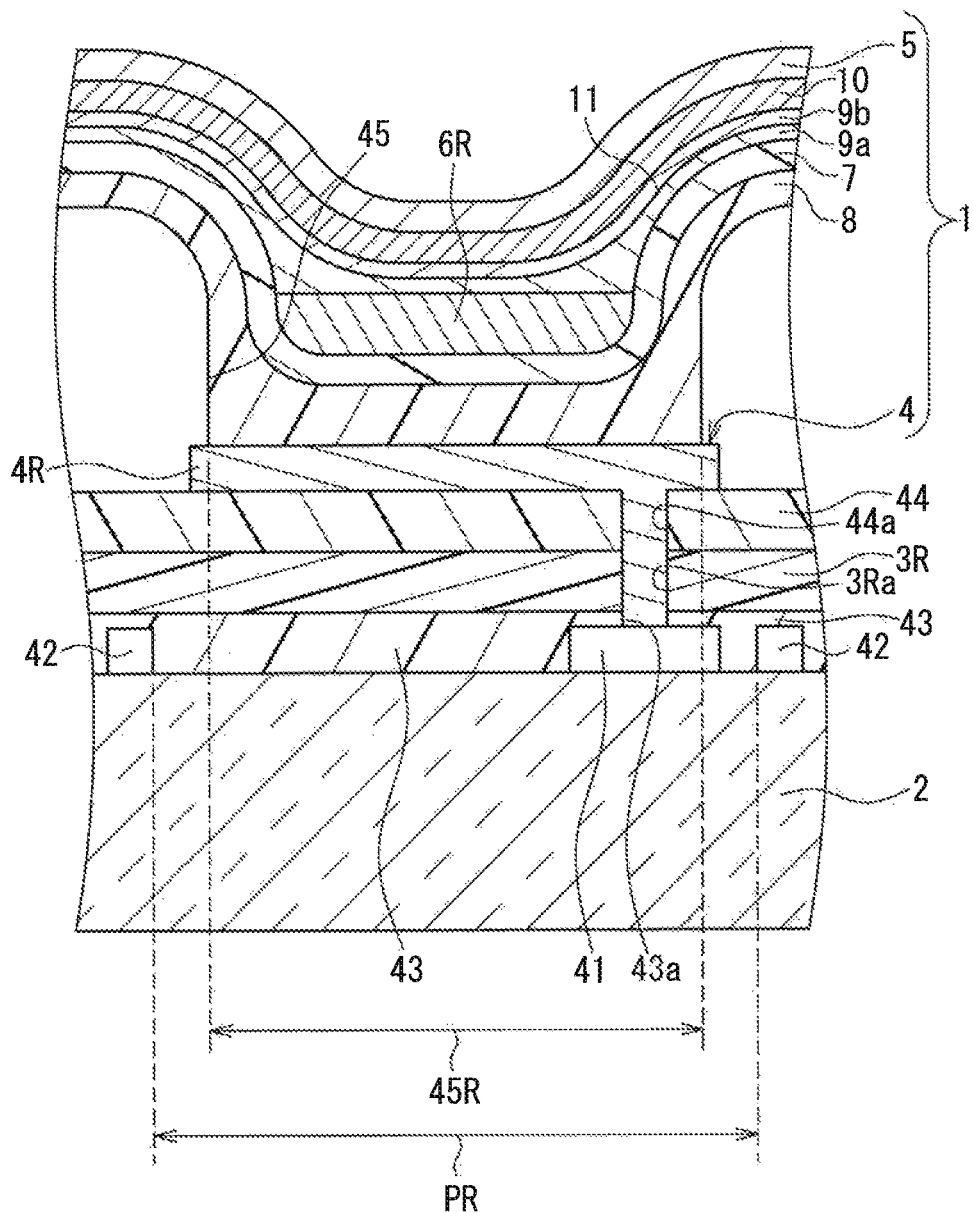
FIG. 3 is a cross-sectional view showing a specific configuration example of the organic EL element when it is applied to an active matrix organic EL display device.

FIG. 3 is a cross-sectional view showing a specific configuration example of the organic EL element when it is applied to an active matrix organic EL display device.

As shown in FIG. 3, on the substrate 2, a TFT 41 (switching element), wiring 42, a protective film 43, a red color filter 3R, an interlayer film 44 (interlayer insulating film, flattening film), an edge cover 45, and the like are provided.

The TFT 41 functions as a switching element to control the luminescence of a red sub-pixel PR, and is connected to the wiring 42.

The protective film 43 is composed of, e.g., a nitride film or an oxide film, and provided on the TFT 41 and the wiring 42 to protect the TFT 41 and the wiring 42.

The red color filter 3R adjusts the wavelength region of red light emitted from the luminescent layer 6 (red luminescent layer 6R) to the outside as indicated by the arrows A and B in FIG. 2.

The interlayer film 44 is composed of e.g., an organic film. The interlayer film 44 also functions as a flattening film, and is stacked on the color filter 3R.

On the interlayer film 44, an anode 4R for red color is formed per sub-pixel PR. The anode 4R is electrically connected to the TFT 41 via a contact hole 44a formed in the interlayer film 44, a contact hole 3Ra formed in the color filter 3R, and a contact hole 43a formed in the protective film 43.

The edge cover 45 is formed on the interlayer film 44 so as to cover a pattern end of the anode 4R. The edge cover 45 is an insulating layer to prevent short circuit of the anode 4R and the cathode 5 constituting the organic EL element 1, which occurs at the pattern end of the anode 4R due to the thinned organic EL layer between the anode 4R and the cathode 5, concentration of the electric field, etc.

In the edge cover 45, an opening 45R is provided per sub-pixel PR. The opening 45R of the edge cover 45 is a luminescent region of the sub-pixel PR. The edge cover 45 also functions as an element isolation film.

Next, a method for producing the organic EL element 1 shown in FIG. 3 will be specifically described with reference to FIG. 4.

Figure 4:
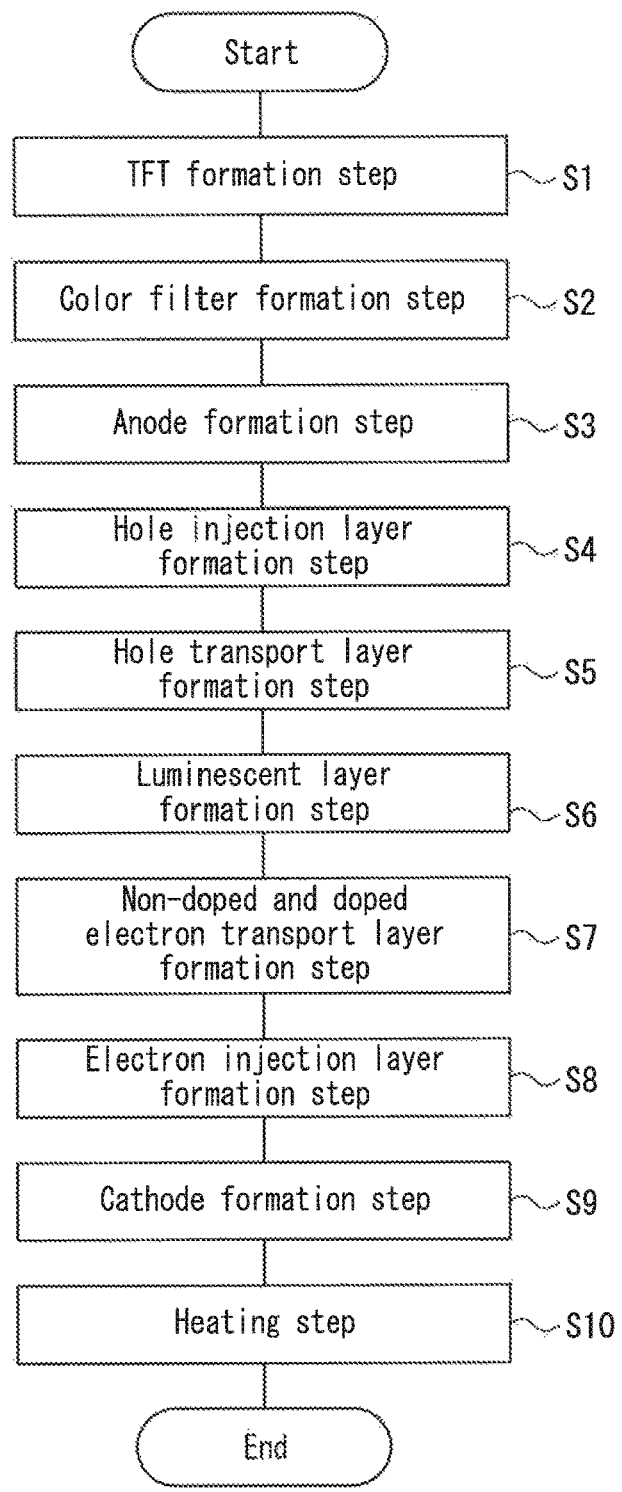
FIG. 4 is a flowchart illustrating the production steps of the organic EL element shown in FIG. 3.

FIG. 4 is a flowchart illustrating the production steps of the organic EL element shown in FIG. 3.

As shown in a step S1 in FIG. 4, in the organic EL element 1, first a TFT formation step of forming the TFT 41 on the substrate 2 is performed. In this TFT formation step, the wiring 42 is formed simultaneously with or at a different timing from the formation of the TFT 41. Subsequent to the TFT formation step, a step of forming the protective film 43 on the TFT 41 and the wiring 42 is performed.

Subsequently, as shown in a step S2 in FIG. 4, a color filter formation step of forming the color filter 3R on the protective film 43 is performed. In this color filter formation step, the color filter 3R is formed on the protective film 43 in a predetermined pattern using, e.g., a photolithography method.

Next, as shown in a step S3 in FIG. 4, subsequent to the formation of the interlayer film 44 on the color filter 3R, an anode formation step of forming the anode 4R for red color on the interlayer film 44 is performed. In this anode formation step, the anode 4R is formed on the interlayer film 44 using, e.g., a vacuum deposition method.

Subsequently, as shown in a step S4 in FIG. 4, a hole injection layer formation step of forming the hole injection layer 8 on the anode 4R is performed. In this hole injection layer formation step, the hole injection layer 8 is formed on the anode 4R using, e.g., a vacuum deposition method.

Next, as shown in a step S5 in FIG. 4, a hole transport layer formation step of forming the hole transport layer 7 on the hole injection layer 8 is performed. In this hole transport layer formation step, the hole transport layer 7 is formed on the hole injection layer 8 using, e.g., a vacuum deposition method.

Subsequently, as shown in a step S6 in FIG. 4, a luminescent layer formation step of forming the red luminescent layer 6R on the hole transport layer 7 is performed. In this luminescent layer formation step, the luminescent layer 6R is formed on the hole transport layer 7 using, e.g., a vacuum deposition method.

Subsequently, as shown in a step S7 in FIG. 4, a non-doped and doped electron transport layer formation step of sequentially forming the non-doped electron transport layer 9a and the doped electron transport layer 9b on the luminescent layer 6R and the hole transport layer 7 is performed. In this non-doped and doped electron transport layer formation step, the non-doped electron transport layer 9a is formed on the luminescent layer 6R and the hole transport layer 7 using, e.g., a vacuum deposition method. Then, the doped electron transport layer 9b is formed on the non-doped electron transport layer 9a by, e.g., a codeposition method using the above host material and dopant material.

Subsequently, as shown in a step S8 in FIG. 4, an electron injection layer formation step of forming the electron injection layer 10 on the doped electron transport layer 9b is performed. In this electron injection layer formation step, the electron injection layer 10 is formed on the doped electron transport layer 9b using, e.g., a vacuum deposition method.

Next, as shown in a step S9 in FIG. 4, a cathode formation step of forming the cathode 5 on the electron injection layer 10 is performed. In this cathode formation step, the cathode 5 is formed on the electron injection layer 10 using, e.g., a vacuum deposition method.

Subsequently, as shown in a step S10 in FIG. 4, a heating step of heating the organic EL element 1 is performed. Specifically, in this heating step, the organic EL element 1 is annealed at, e.g., 80° C. for one hour. Thus, the n-type dopant material added in the doped electron transport layer 9b can be gathered at the interface between the non-doped electron transport layer 9a and the doped electron transport layer 9b, and thereby the first reflection surface 11 that reflects light from the luminescent layer 6R is formed at the interface.

The organic EL element 1 of this embodiment is produced through the above production steps.

Next, the specific emission spectra of the organic EL element 1 of this embodiment will be described with reference to FIG. 5.

Figure 5:
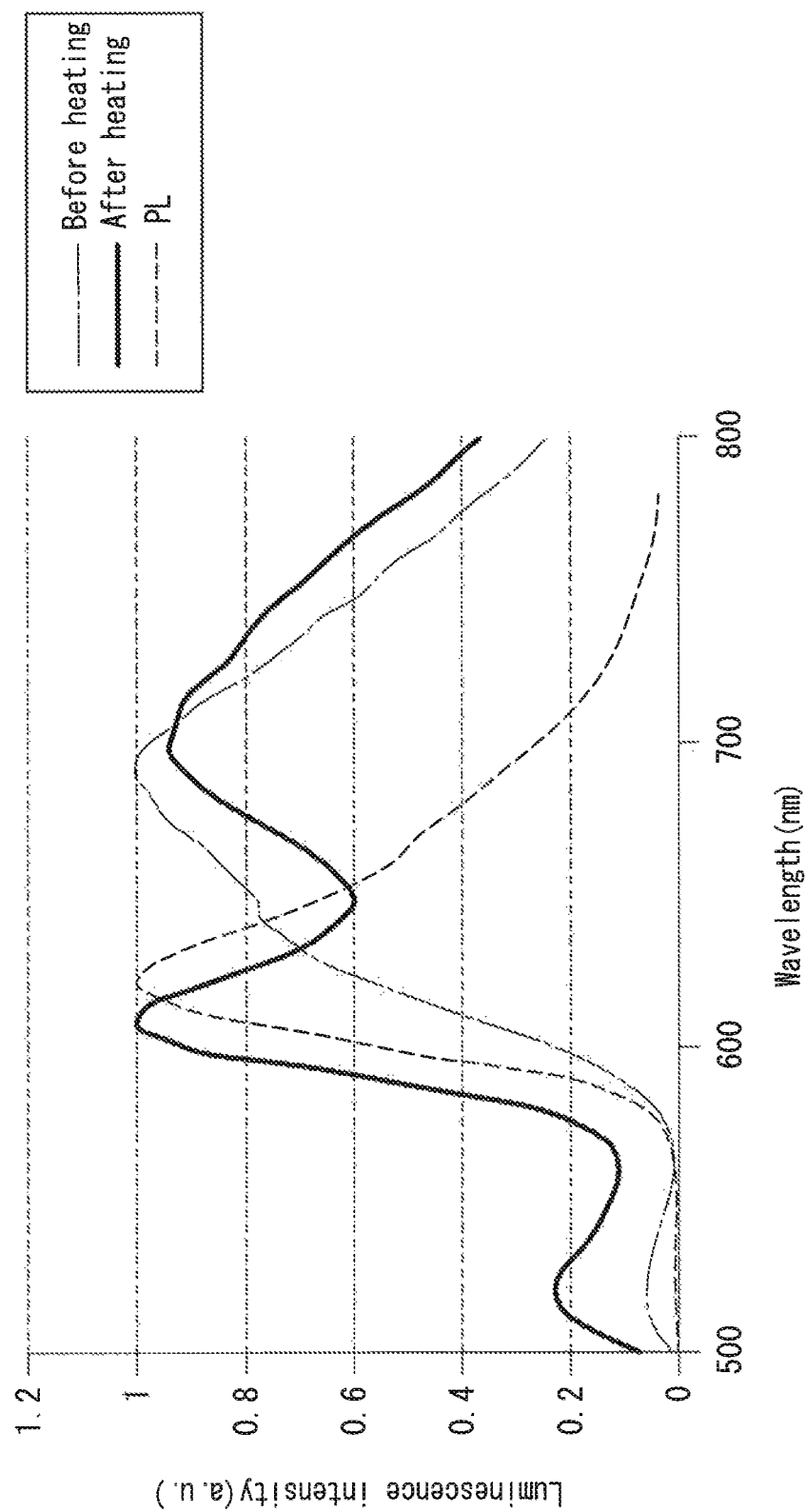
FIG. 5 is a graph showing a specific example of the spectra of light emitted from the organic EL element.

FIG. 5 is a graph showing a specific example of the spectra of light emitted from the organic EL element.

An spectral characteristic of the red luminescent layer 6R possessed by itself is that it has a peak wavelength of 610 nm, as exemplified by a dotted line in FIG. 5.

Further, before the heating step shown in the step S10 in FIG. 4 (i.e., when the heating (annealing) is not performed to form the first reflection surface 11 at the interface between the non-doped electron transport layer 9a and the doped electron transport layer 9b), the light from the luminescent layer 6 is emitted to the outside as light having a peak wavelength of about 690 nm, as exemplified by an alternate long and short dashed line in FIG. 5.

Meanwhile, when the heating step is performed to form the first reflection surface 11 at the interface between the non-doped electron transport layer 9a and the doped electron transport layer 9b, the light from the luminescent layer 6 is separately emitted to the outside as light having a peak wavelength of about 600 nm and light having a peak wavelength of about 700 nm, as exemplified by a solid line in FIG. 5. Thus, in the organic EL element 1 of this embodiment, as indicated by the arrows A and B in FIG. 2, light having two peaks is emitted to the outside.

The spectra of light to be emitted to the outside from the organic EL element 1 of this embodiment are not limited to those shown in FIG. 5. The spectra can be changed depending on, e.g., the thickness of the luminescent layer 6 and the type of the luminescent dopant material thereof the thickness of the non-doped electron transport layer 9a and the doped electron transport layer 9b and the type of the dopant material of the doped electron transport layer 9b, or the thickness and the material of the anode 4 (the anode 4R) or the characteristic of the color filter 3 (color filter 3R).

In order to emit the light having two peak wavelengths to the outside, for example, the color filter 3 may be omitted, or a color filter 3R to cut off a wavelength region between the two peak wavelengths may be provided. In order to only emit light having one of the peak wavelengths to the outside, a color filter 3R to cut off the light having the other peak wavelengths may be used.

In the organic EL element 1 of this embodiment configured as above, the cathode 5 is composed of a reflecting electrode. The electron transport layer 9 is composed of the doped electron transport layer 9b to which an n-type dopant material is added and the non-doped electron transport layer 9a to which an n-type dopant material is not added. Further, the first reflection surface (reflection surface) 11 that reflects light from the luminescent layer 6 is provided at the interface between the non-doped electron transport layer 9a and the doped electron transport layer 9b. Thus, in the organic EL element 1 of this embodiment, it is possible to emit light having two peaks (wavelengths) to the outside as exemplified by a solid line in FIG. 5, without providing a plurality of luminescent layers. In other words, in the organic EL element 1 of this embodiment, since a single luminescent layer 6 enables light having two peaks to be emitted to the outside, the carrier balance between holes and electrons in the luminescent layer 6 can be adjusted easily while preventing the application voltage from increasing. Therefore, in this embodiment, unlike the above conventional example, it is possible to configure the organic EL element 1 having a simple structure that is produced easily and that has an excellent luminescence property while emitting light having a plurality of peaks.

Further, in this embodiment, since the cathode 5 is composed of a reflecting electrode and the light from the luminescent layer 6 is emitted from the anode 4 side to the outside, it is possible to configure the bottom emission type organic EL element 1 having a simple structure that is produced easily and that has an excellent luminescence property while emitting light having a plurality of peaks.

Embodiment 2

Figure 6:
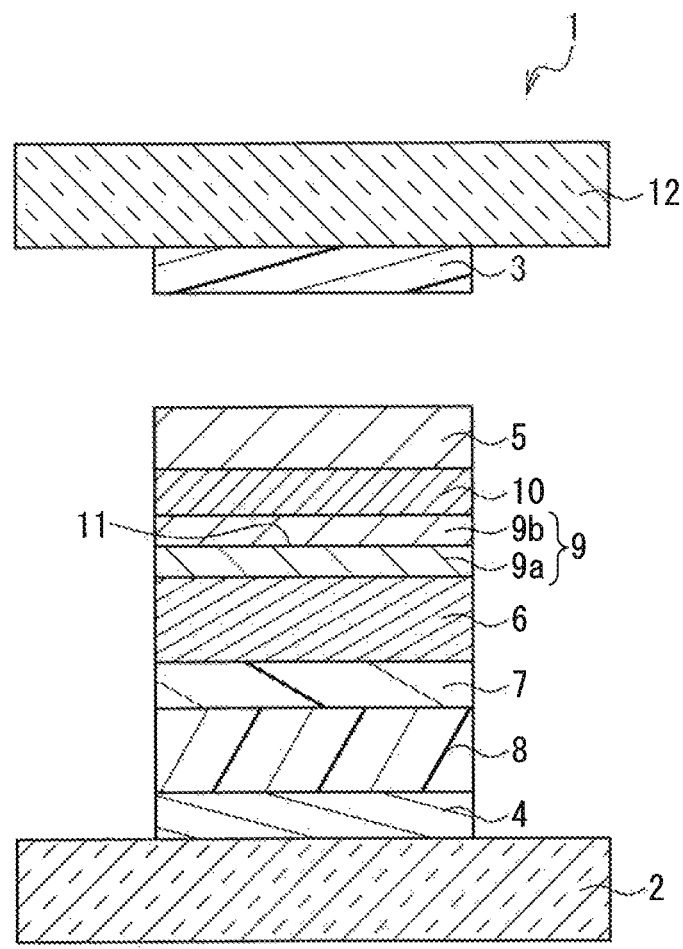
FIG. 6 is a cross-sectional view showing the configuration of an organic EL element according to Embodiment 2 of the present invention.
Figure 7:
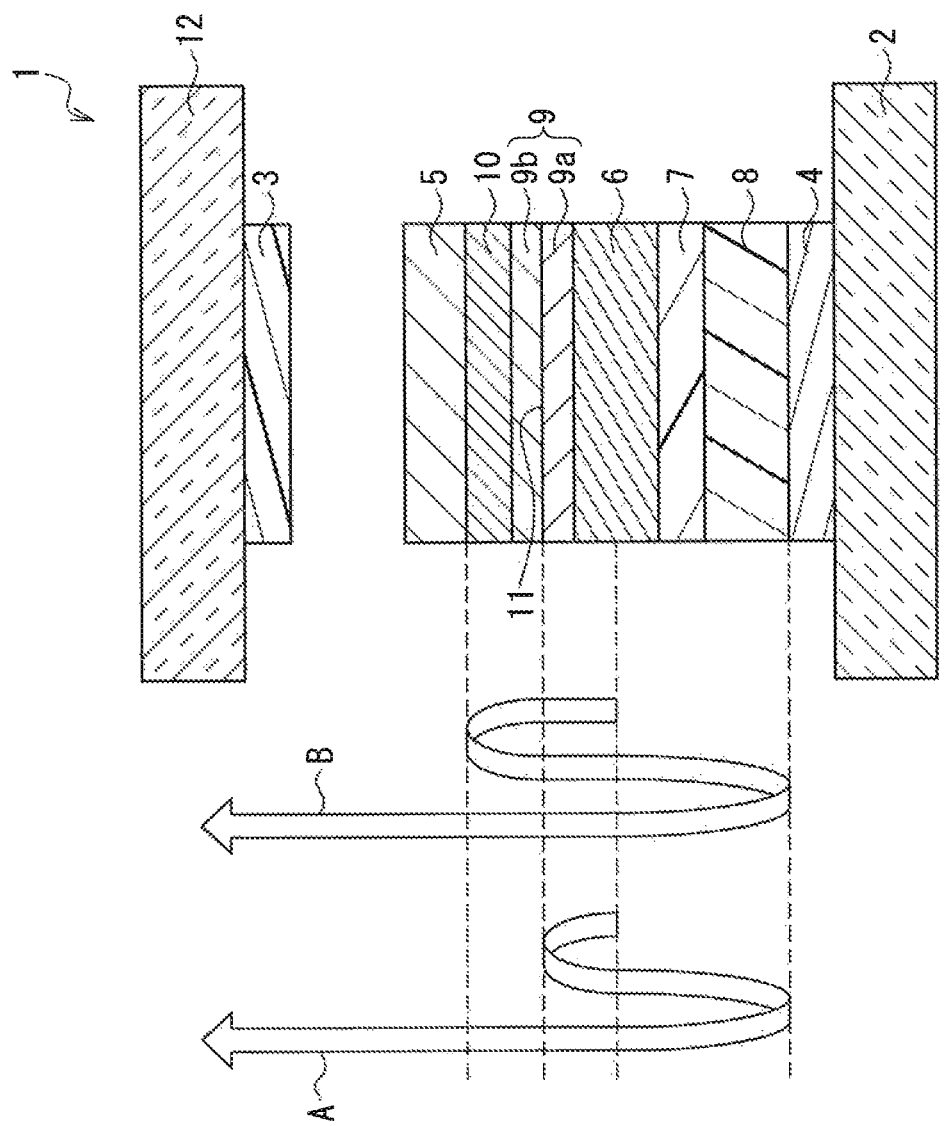
FIG. 7 is a view illustrating of the action of the organic EL element shown in FIG. 6.
Figure 8:
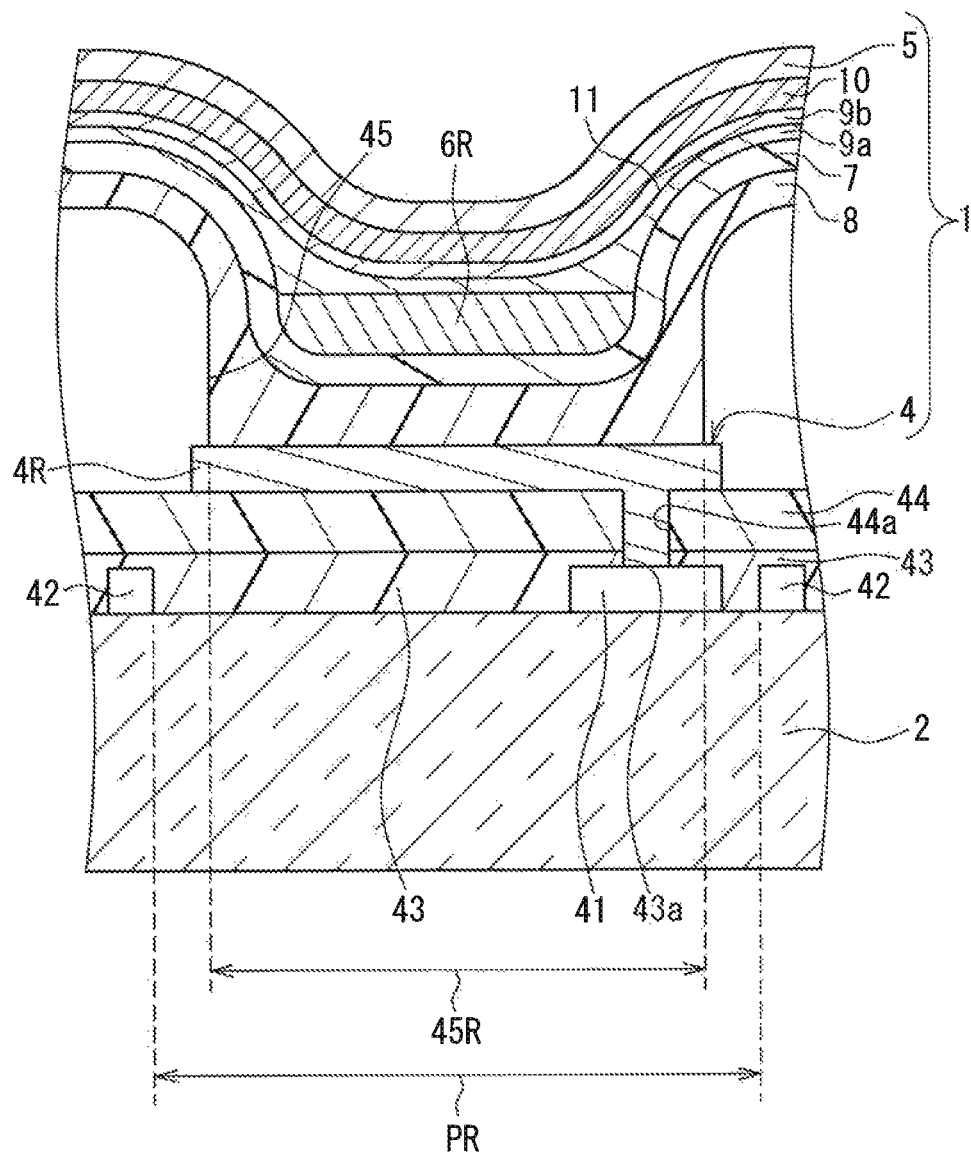
FIG. 8 is a cross-sectional view showing a specific configuration example of the organic EL element shown in FIG. 6 when it is applied to an active matrix organic EL display device.
Figure 9:
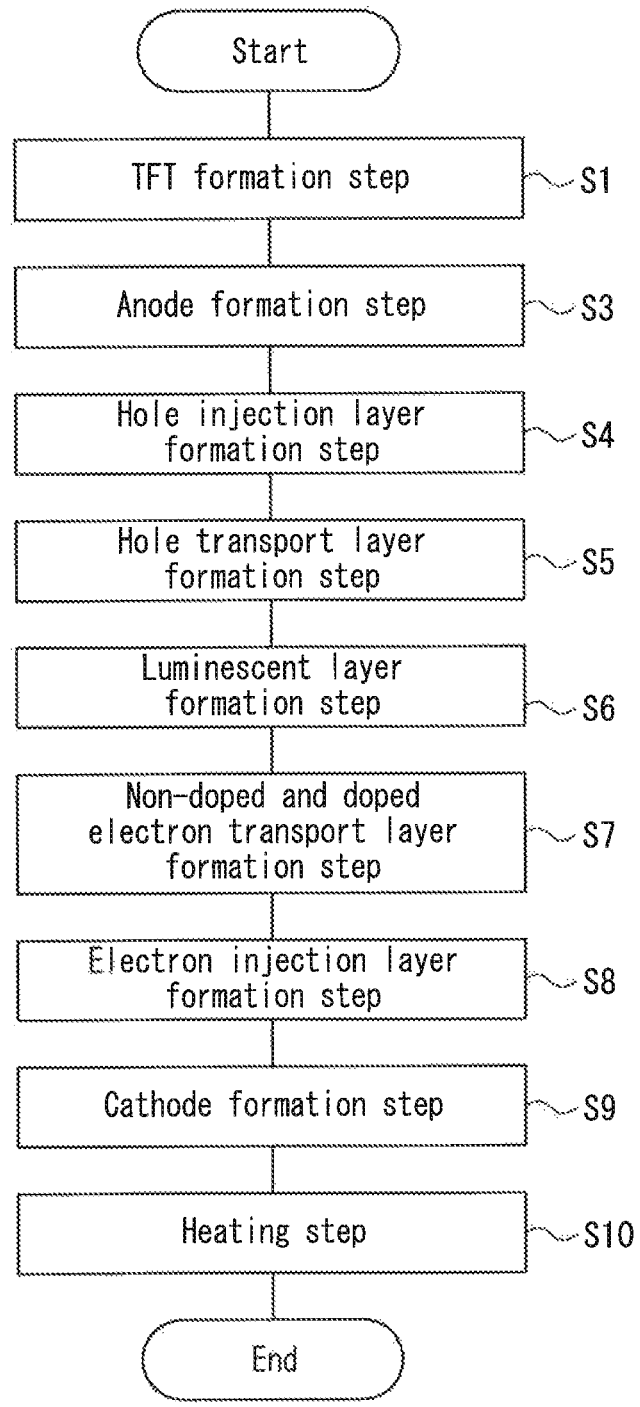
FIG. 9 is a flowchart illustrating the production steps of the organic EL element shown in FIG. 8.

FIG. 6 is a cross-sectional view showing the configuration of an organic EL element according to Embodiment 2 of the present invention. FIG. 7 is a view illustrating of the action of the organic EL element shown in FIG. 6. FIG. 8 is a cross-sectional view showing a specific configuration example of the organic EL element shown in FIG. 6 when it is applied to an active matrix organic EL display device. FIG. 9 is a flowchart illustrating the production steps of the organic EL element shown in FIG. 8.

In the drawings, this embodiment is mainly different from Embodiment 1 in that a top emission type organic EL element that emits light from the luminescent layer from the cathode side is configured. Here, components in common with those in Embodiment 1 are assigned with the same reference numbers, and a duplicated explanation is omitted.

As shown in FIG. 6, the organic EL element 1 of this embodiment includes the anode 4, the hole injection layer 8, the hole transport layer 7, the luminescent layer 6, the electron transport layer 9, the electron injection layer 10, and the cathode 5 that are formed on the substrate 2 in this order. The organic EL element 1 of this embodiment further includes a counter substrate 12 provided opposite to the substrate 2, and the color filter 3 provided on the counter substrate 12 on the substrate 2 side.

In the organic EL element 1 of this embodiment, the anode 4 is composed of a reflecting electrode. The organic EL element 1 of this embodiment is a top emission type that emits light from the luminescent layer 6 from the cathode 5 (the counter substrate 12) side to the outside.

Further, as shown in FIG. 7, in the organic EL element 1 of this embodiment, part of light from the luminescent layer 6 is reflected to the anode 4 side at the first reflection surface 11, reflected to the cathode 5 side at an interface between the anode 4 and the hole injection layer 8, and emitted to the outside as indicated by an arrow A in FIG. 7.

Further, as indicated by an arrow B in FIG. 7, part of light from the luminescent layer 6 passes through the first reflection surface 11, and is reflected to the anode 4 side at an interface between the cathode 5 and the electron injection layer 10. Then, the light is reflected to the cathode 5 side at the interface between the anode 4 and the hole injection layer 8 and emitted to the outside. This light has a peak different from that of light indicated by the arrow A in FIG. 7.

Thus, the organic EL element 1 of this embodiment can emit light having at least two peaks to the outside, similarly to the organic EL element 1 of Embodiment 1.

When red sub-pixels of an active matrix organic EL display device are constituted using the organic EL element 1 of this embodiment, similarly to the organic EL element 1 of Embodiment 1, the TFT 41 (switching element), the wiring wiring 42, the protective film 43, the interlayer film 44 (interlayer insulating film, flattening film), the edge cover 45, and the like are provided on the substrate 2 as shown in FIG. 8. Unlike the organic EL element 1 of Embodiment 1, the red color filter 3R is not provided on the substrate 2.

Further, as shown in steps S1 and S3-S10 in FIG. 9, in the organic EL element 1 of this embodiment, the respective constituent elements on the substrate 2 side are formed in the same manner as in Embodiment 1. Meanwhile, on the counter substrate 12 side, the color filter formation step shown in the step S2 in FIG. 4 is performed so as to form the color filter 3 on the counter substrate 12. Thereafter, the substrate 2 and the counter substrate 12 are adhered to each other. Thus, the organic EL element 1 of this embodiment is produced.

With the above configuration, Embodiment 2 achieves effects similar to those of Embodiment 1 described above.

Further, in this embodiment, since the anode 4 is composed of a reflecting electrode and the light from the luminescent layer 6 is emitted from the cathode 5 side to the outside, it is possible to configure the top emission type organic EL element 1 having a simple structure that is produced easily and that has an excellent luminescence property while emitting light having a plurality of peaks.

Further, in this embodiment, since the top emission type organic EL element 1 is configured, it is possible to increase an aperture ratio as compared with that in Embodiment 1.

Further, in this embodiment, since the color filter 3 is provided on the counter substrate 12 side, the step of forming the color filter 3 can be simplified as compared with that in Embodiment 1. Thus, the manufacturing yield is improved easily.

Embodiment 3

Figure 10:
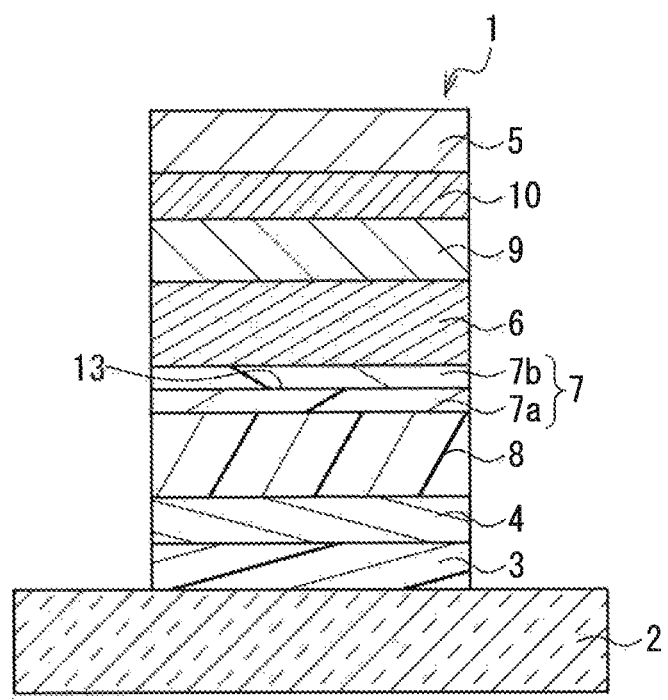
FIG. 10 is a cross-sectional view showing the configuration of an organic EL element according to Embodiment 3 of the present invention.
Figure 11:
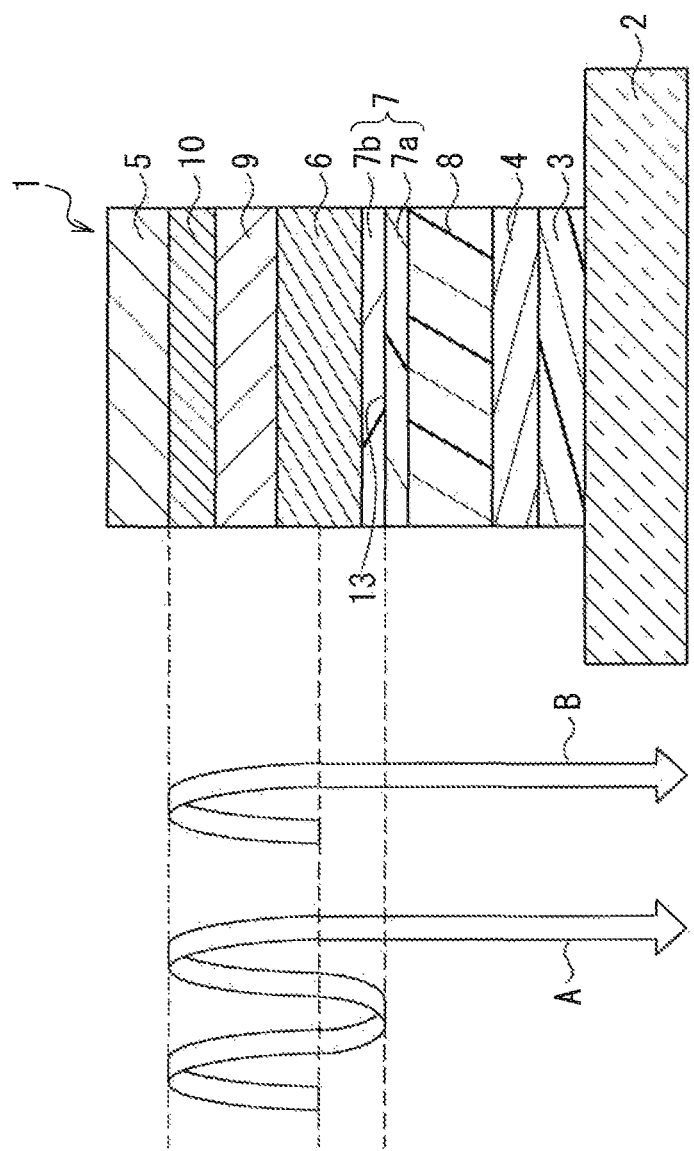
FIG. 11 is a view illustrating of the action of the organic EL element shown in FIG. 10.
Figure 12:
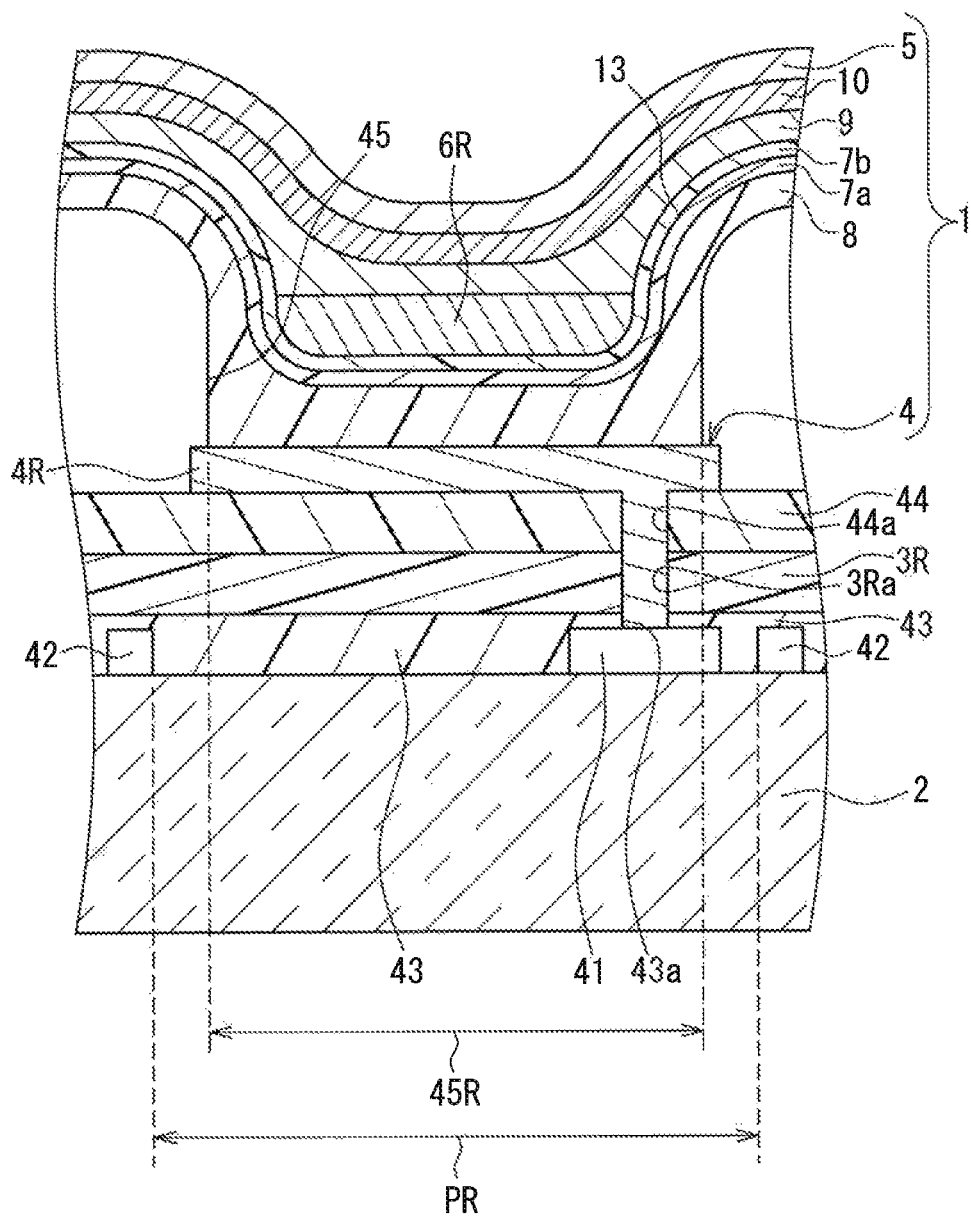
FIG. 12 is a cross-sectional view showing a specific configuration example of the organic EL element shown in FIG. 10 when it is applied to an active matrix organic EL display device.
Figure 13:
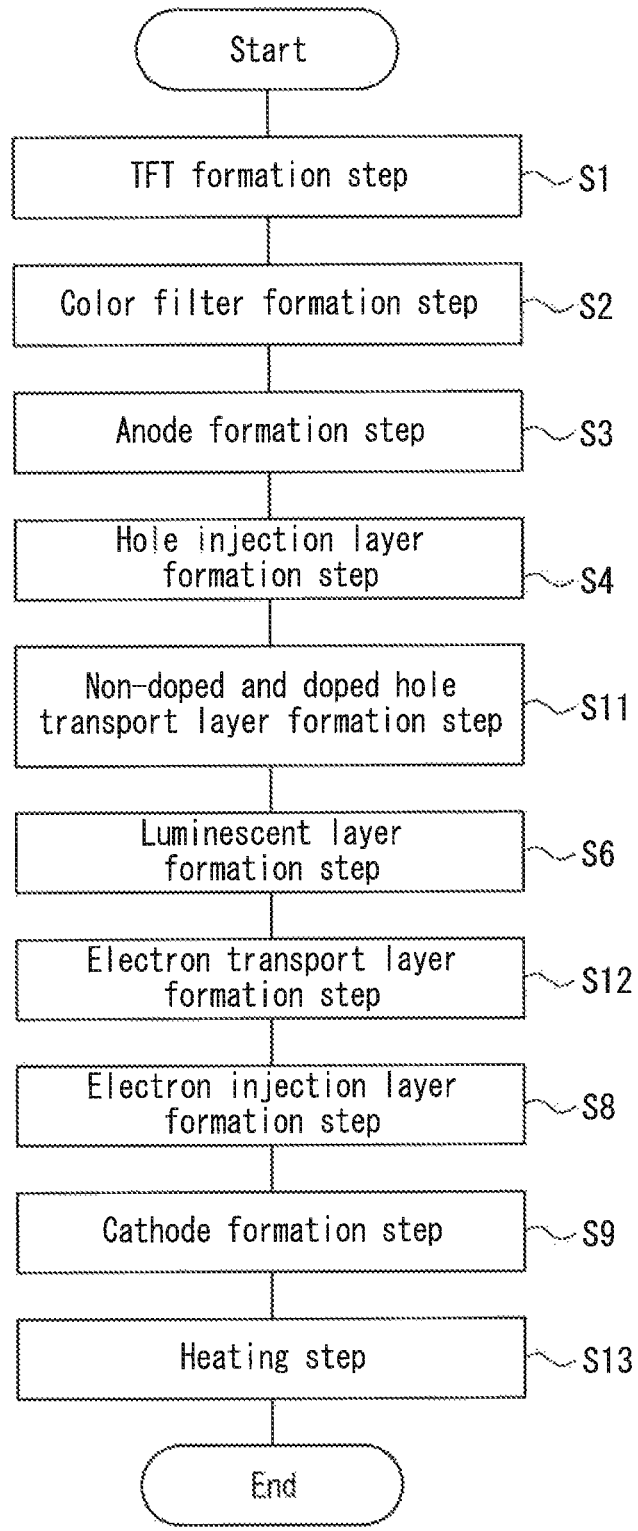
FIG. 13 is a flowchart illustrating the production steps of the organic EL element shown in FIG. 12.

FIG. 10 is a cross-sectional view showing the configuration of an organic EL element according to Embodiment 3 of the present invention. FIG. 11 is a view illustrating of the action of the organic EL element shown in FIG. 10. FIG. 12 is a cross-sectional view showing a specific configuration example of the organic EL element shown in FIG. 10 when it is applied to an active matrix organic EL display device. FIG. 13 is a flowchart illustrating the production steps of the organic EL element shown in FIG. 12.

In the drawings, this embodiment is mainly different from Embodiment 1 in that, instead of providing the doped electron transport layer and the non-doped electron transport layer and the first reflection surface, a doped hole transport layer to which a p-type dopant material is added and a non-doped hole transport layer to which a p-type dopant material is not added are provided as a hole transport layer, and a second reflection surface is provided at an interface between the doped hole transport layer and the non-doped hole transport layer. Here, components in common with those in Embodiment 1 are assigned with the same reference numbers, and a duplicated explanation is omitted.

In FIG. 10, the electron transport layer 9 of the organic EL element 1 of this embodiment does not include a doped electron transport layer to which an n-type dopant material is added, and is only composed of a non-doped electron transport layer.

In the organic EL element 1 of this embodiment, the hole transport layer 7 includes a doped hole transport layer 7a to which a p-type dopant material is added and a non-doped hole transport layer 7b to which a p-type dopant material is not added. Further, a second reflection surface 13 is provided at an interface between the non-doped hole transport layer 7b and the doped hole transport layer 7a to which a p-type dopant material is added, as a reflection surface to reflect light from the luminescent layer 6.

Specifically, similarly to the hole transport layer 7 of Embodiment 1, the non-doped hole transport layer 7b is made of, e.g., 4,4'-bis[N-(1-naphthyl)-N-phenyl-amino]-biphenyl (α-NPD). The doped hole transport layer 7a is formed by adding (doping) a p-type dopant material such as a metal (e.g., molybdenum, tungsten, vanadium) to a host material (e.g., the above α-NPD).

The second reflection surface 13 is formed at an interface between the non-doped hole transport layer 7b and the doped hole transport layer 7a by gathering at the interface the p-type dopant material added in the doped hole transport layer 7a. The second reflection surface 13 reflects a certain wavelength region of light from the luminescent layer 6 to the cathode 5 side while transmitting a different wavelength region of light from the luminescent layer 6 to the anode 4 side. Thus, the organic EL element 1 of this embodiment can emit light having a plurality of peaks.

Specifically, as shown in FIG. 11, in the organic EL element 1 of this embodiment, part of light from the luminescent layer 6 is reflected to the anode 4 side at an interface between the cathode 5 and the electron injection layer 10, and reflected to the cathode 5 side at the second reflection surface 13 as indicated by an arrow A in FIG. 11. Then, the light is reflected again to the anode 4 side at the interface between the cathode 5 and the electron injection layer 10, and emitted to the outside.

Further, as indicated by an arrow B in FIG. 11, part of light from the luminescent layer 6 is reflected to the anode 4 side at the interface between the cathode 5 and the electron injection layer 10, passes through the second reflection surface 13, and is emitted to the outside. This light has a peak different from that of light indicated by the arrow A in FIG. 11.

Thus, similarly to the organic EL element 1 of Embodiment 1, the organic EL element 1 of this embodiment can emit light having at least two peaks to the outside.

When red sub-pixels of an active matrix organic EL display device are constituted using the organic EL element 1 of this embodiment, similarly to the organic EL element 1 of Embodiment 1, the TFT 41 (switching element), the wiring wiring 42, the protective film 43, the red color filter 3R, the interlayer film 44 (interlayer insulating film, flattening film), the edge cover 45, and the like are provided on the substrate 2 as shown in FIG. 12.

Further, as shown in a step S11 in FIG. 13, after completion of the hole injection layer formation step, a non-doped and doped hole transport layer formation step of sequentially forming the doped hole transport layer 7a and the non-doped hole transport layer 7b on the hole injection layer 8 is performed. In this non-doped and doped hole transport layer formation step, the doped hole transport layer 7a is formed on the hole injection layer 8 by, e.g., a codeposition method using the above host material and dopant material. Then, the non-doped hole transport layer 7b is formed on the doped hole transport layer 7a using, e.g., a vacuum deposition method.

Further, as shown in a step S12 in FIG. 13, an electron transport layer formation step of forming the electron transport layer 9 on the luminescent layer 6R and the non-doped hole transport layer 7b is performed. In this electron transport layer formation step, the electron transport layer 9 is formed on the luminescent layer 6R and the hole transport layer 7 using, e.g., a vacuum deposition method.

Further, as shown in a step S13 in FIG. 13, a heating step of heating the organic EL element 1 is performed. Specifically, in this heating step, the organic EL element 1 is annealed at, e.g., 80° C. for one hour. Thus, the p-type dopant material added in the doped hole transport layer 7a can be gathered at the interface between the doped hole transport layer 7a and the non-doped hole transport layer 7b, and thereby the second reflection surface 13 that reflects light from the luminescent layer 6R is formed at the interface.

With the above configuration, Embodiment 3 achieves effects similar to those of Embodiment 1 described above. Specifically, in this embodiment, by providing the second reflection surface 13, it is possible to emit light having at least two peaks to the outside without providing a plurality of luminescent layers.

Further, in this embodiment, since the cathode 5 is composed of a reflecting electrode and the light from the luminescent layer 6 is emitted from the anode 4 side to the outside, it is possible to configure the bottom emission type organic EL element 1 having a simple structure that is produced easily and that has an excellent luminescence property while emitting light having a plurality of peaks.

Embodiment 4

Figure 14:
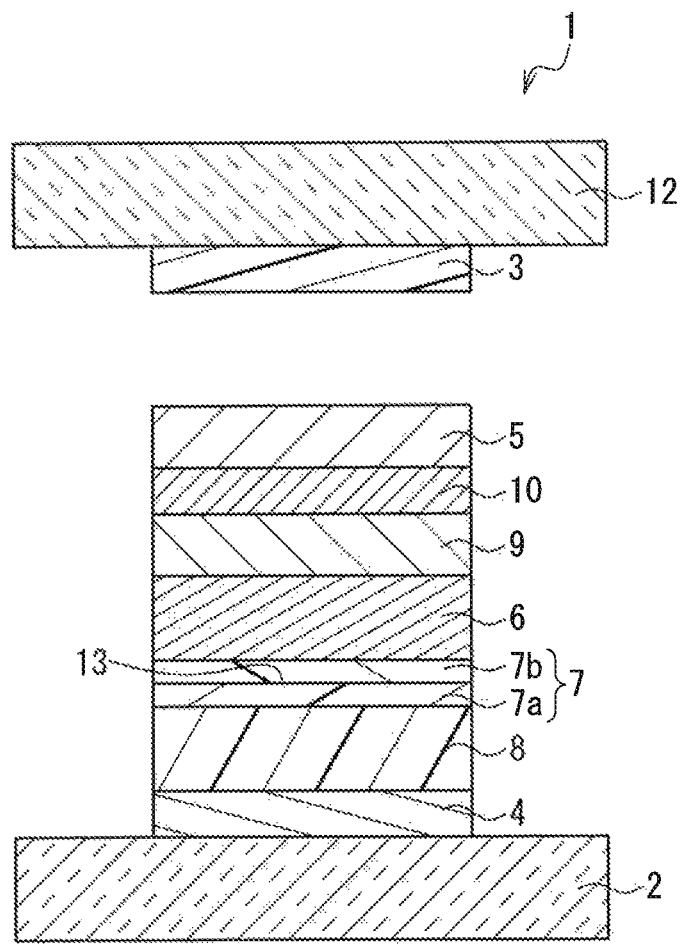
FIG. 14 is a cross-sectional view showing the configuration of an organic EL element according to Embodiment 4 of the present invention.
Figure 15:
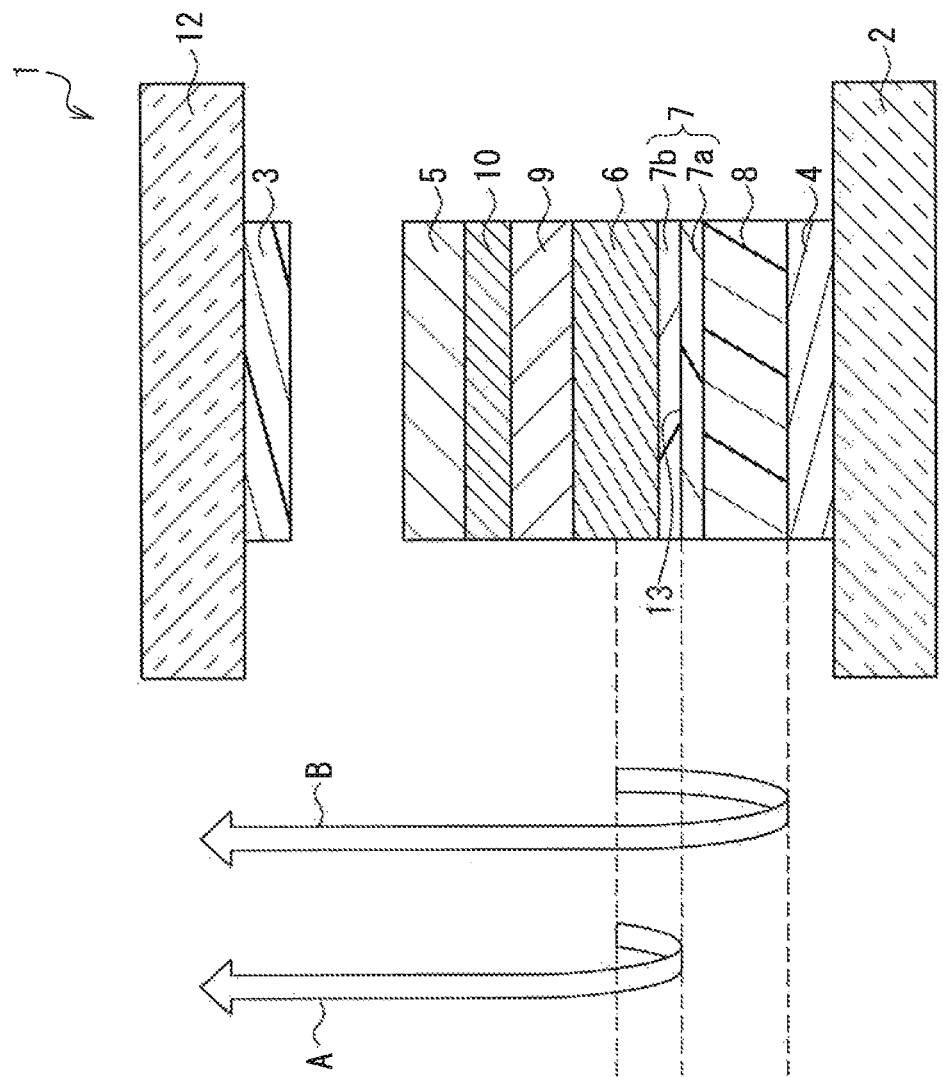
FIG. 15 is a view illustrating of the action of the organic EL element shown in FIG. 14.
Figure 16:
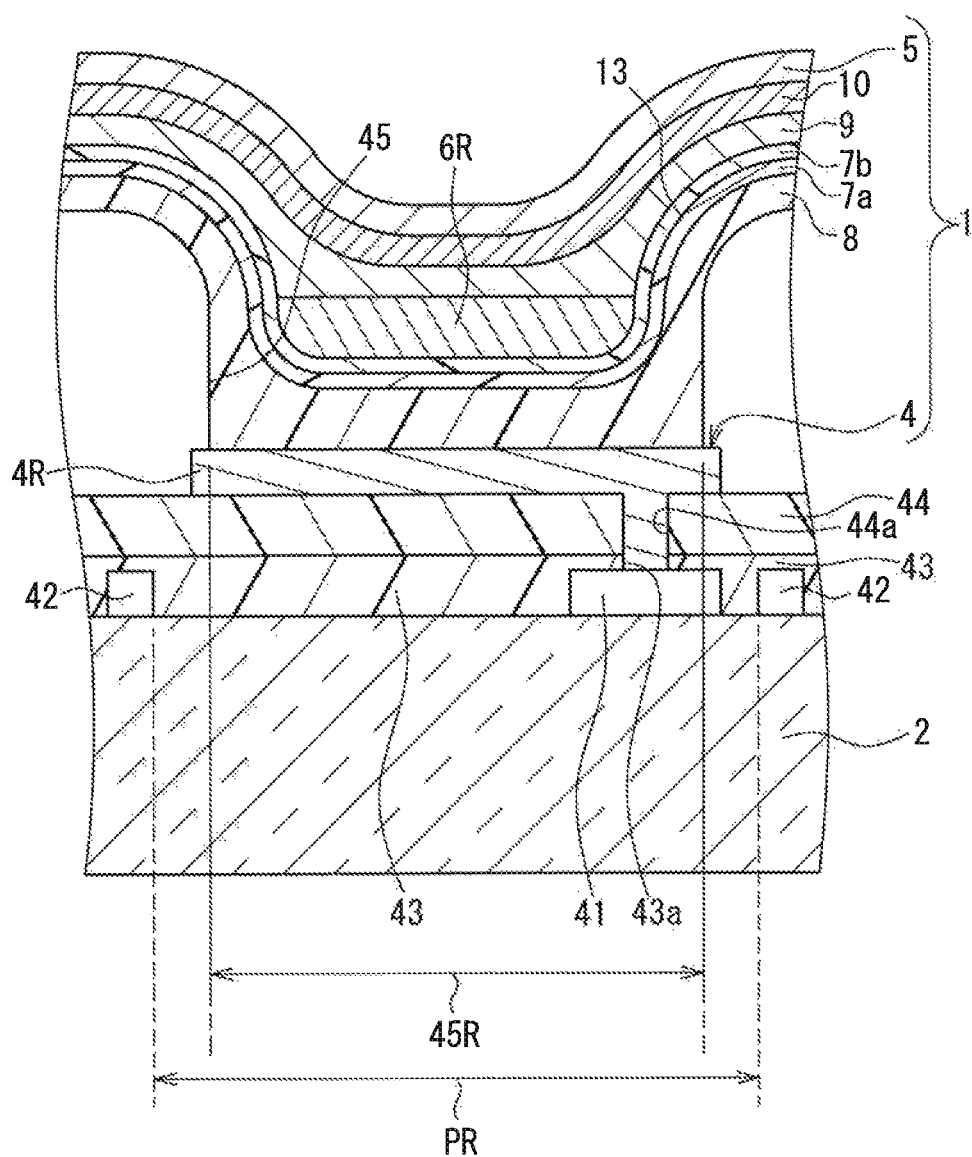
FIG. 16 is a cross-sectional view showing a specific configuration example of the organic EL element shown in FIG. 14 when it is applied to an active matrix organic EL display device.
Figure 17:
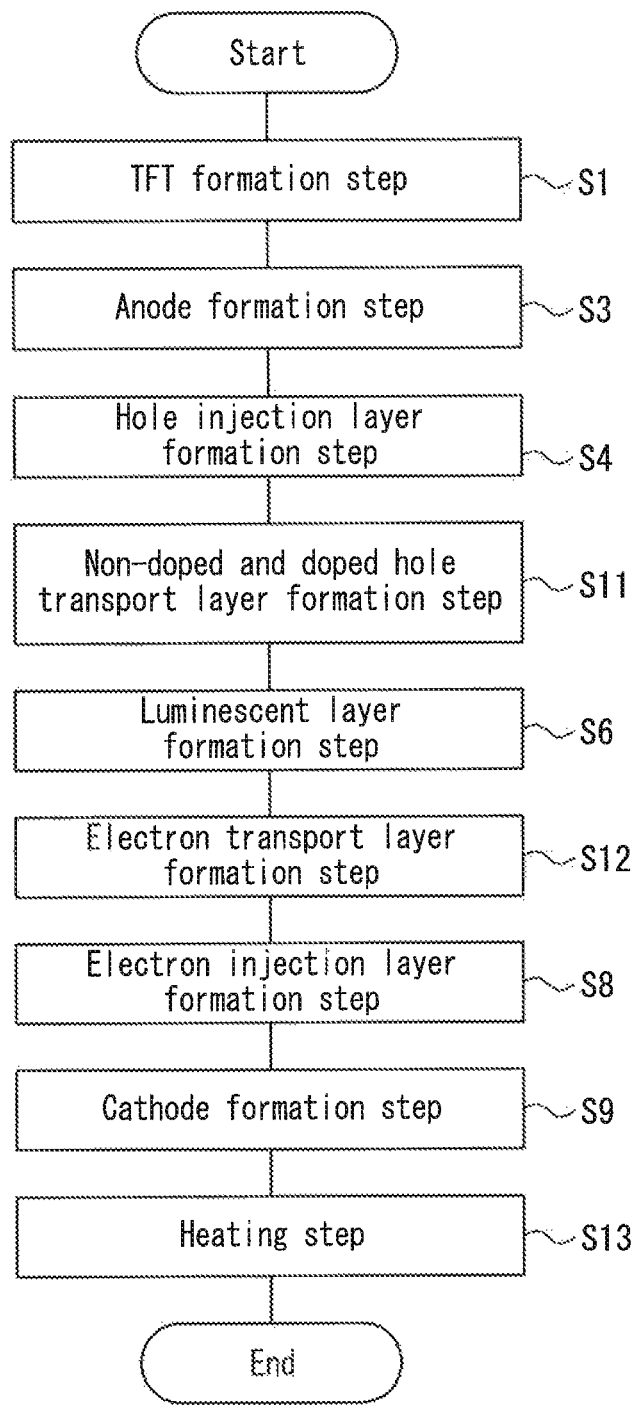
FIG. 17 is a flowchart illustrating the production steps of the organic EL element shown in FIG. 16.

FIG. 14 is a cross-sectional view showing the configuration of an organic EL element according to Embodiment 4 of the present invention. FIG. 15 is a view illustrating of the action of the organic EL element shown in FIG. 14. FIG. 16 is a cross-sectional view showing a specific configuration example of the organic EL element shown in FIG. 14 when it is applied to an active matrix organic EL display device. FIG. 17 is a flowchart illustrating the production steps of the organic EL element shown in FIG. 16.

In the drawings, this embodiment is mainly different from Embodiment 3 in that a top emission type organic EL element that emits light from the luminescent layer from the cathode side is configured. Here, components in common with those in Embodiment 3 are assigned with the same reference numbers, and a duplicated explanation is omitted.

As shown in FIG. 14, the organic EL element 1 of this embodiment includes the anode 4, the hole injection layer 8, the hole transport layer 7, the luminescent layer 6, the electron transport layer 9, the electron injection layer 10, and the cathode 5 that are formed on the substrate 2 in this order. The organic EL element 1 of this embodiment further includes a counter substrate 12 provided opposite to the substrate 2, and the color filter 3 provided on the counter substrate 12 on the substrate 2 side.

In the organic EL element 1 of this embodiment, the anode 4 is composed of a reflecting electrode. The organic EL element 1 of this embodiment is a top emission type that emits light from the luminescent layer 6 from the cathode 5 (the counter substrate 12) side to the outside.

Further, as shown in FIG. 15, in the organic EL element 1 of this embodiment, part of light from the luminescent layer 6 is reflected to the cathode 5 side at the second reflection surface 13, and emitted to the outside as indicated by an arrow A in FIG. 15.

Further, as indicated by an arrow B in FIG. 15, part of light from the luminescent layer 6 passes through the second reflection surface 13, and is reflected to the cathode 5 side at an interface between the anode 4 and the hole injection layer 8 and emitted to the outside. This light has a peak different from that of light indicated by the arrow A in FIG. 15.

Thus, similarly to the organic EL element 1 of Embodiment 1, the organic EL element 1 of this embodiment can emit light having at least two peaks to the outside.

When red sub-pixels of an active matrix organic EL display device are constituted using the organic EL element 1 of this embodiment, similarly to the organic EL element 1 of Embodiment 3, the TFT 41 (switching element), the wiring 42, the protective film 43, the interlayer film 44 (interlayer insulating film, flattening film), the edge cover 45, and the like are provided on the substrate 2 as shown in FIG. 16. Unlike the organic EL element 1 of Embodiment 3, the red color filter 3R is not provided on the substrate 2.

Further, as shown in steps S1, S3, S4, S11, S6, S12, S8, S9 and S13 in FIG. 17, in the organic EL element 1 of this embodiment, the respective constituent elements on the substrate 2 side are formed in the same manner as in Embodiment 3. Meanwhile, on the counter substrate 12 side, the color filter formation step shown in the step S2 in FIG. 13 is performed so as to form the color filter 3 on the counter substrate 12. Thereafter, the substrate 2 and the counter substrate 12 are adhered to each other. Thus, the organic EL element 1 of this embodiment is produced.

With the above configuration, Embodiment 4 achieves effects similar to those of Embodiment 3 described above.

Further, in this embodiment, since the anode 4 is composed of a reflecting electrode and the light from the luminescent layer 6 is emitted from the cathode 5 side to the outside, it is possible to configure the top emission type organic EL element 1 having a simple structure that is produced easily and that has an excellent luminescence property while emitting light having a plurality of peaks.

Further, in this embodiment, since the top emission type organic EL element 1 is configured, it is possible to increase an aperture ratio as compared with that in Embodiment 3.

Further, in this embodiment, since the color filter 3 is provided on the counter substrate 12 side, the step of forming the color filter 3 can be simplified as compared with that in Embodiment 3. Thus, the manufacturing yield is improved easily.

Embodiment 5

Figure 18:
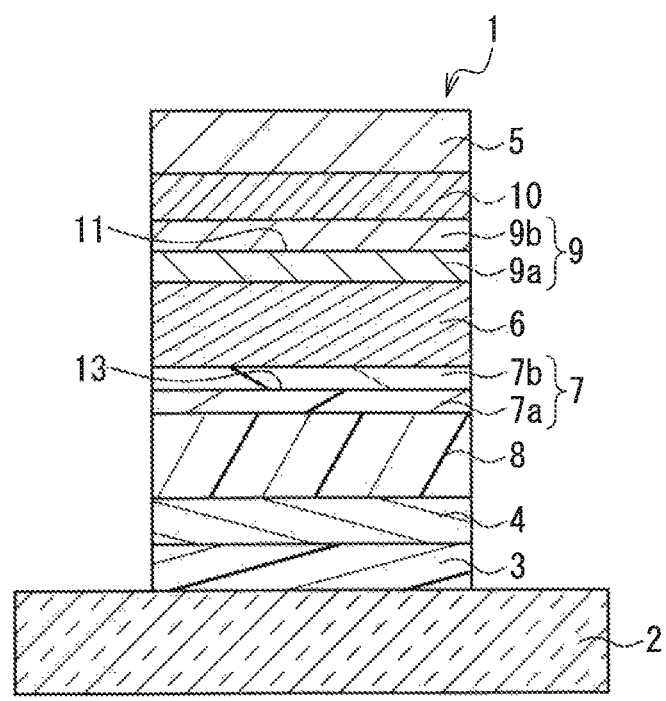
FIG. 18 is a cross-sectional view showing the configuration of an organic EL element according to Embodiment 5 of the present invention.
Figure 19:
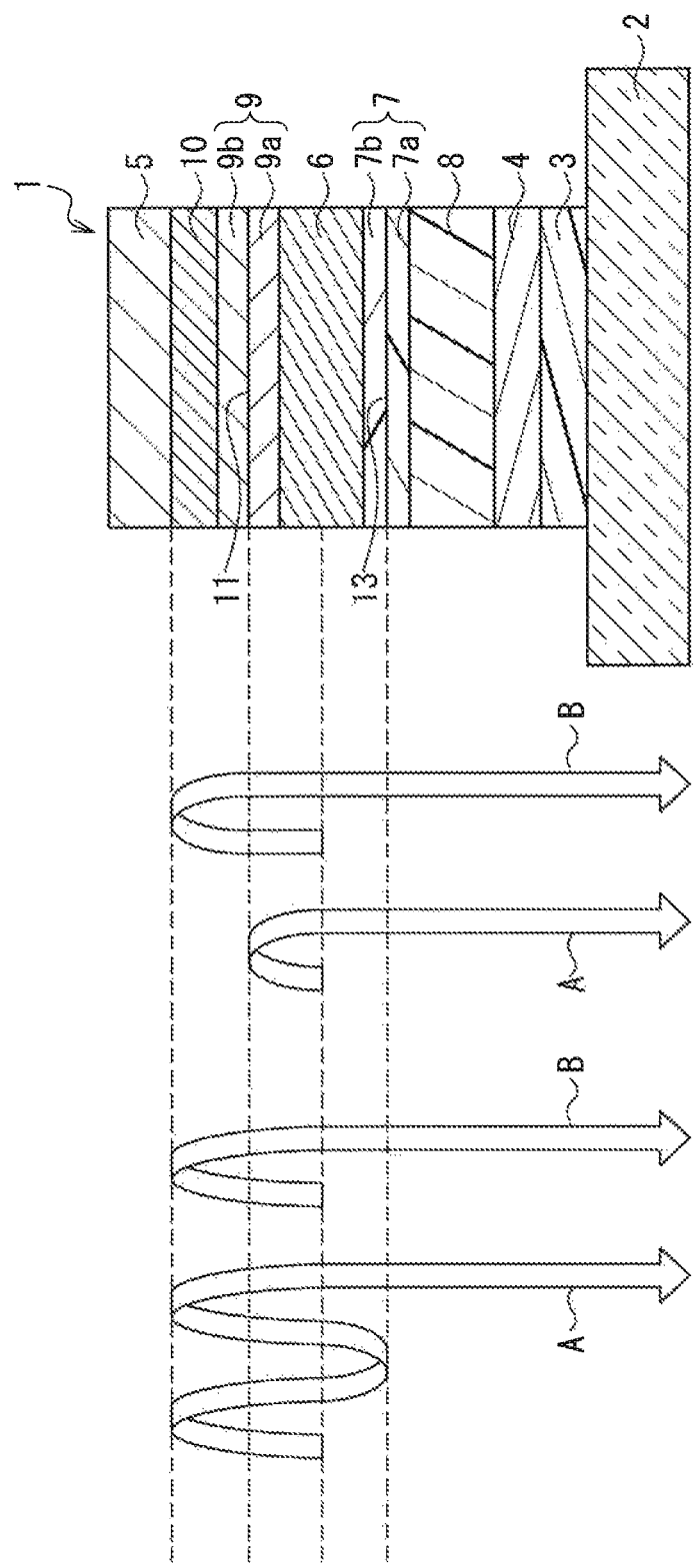
FIG. 19 is a view illustrating of the action of the organic EL element shown in FIG. 18.
Figure 20:
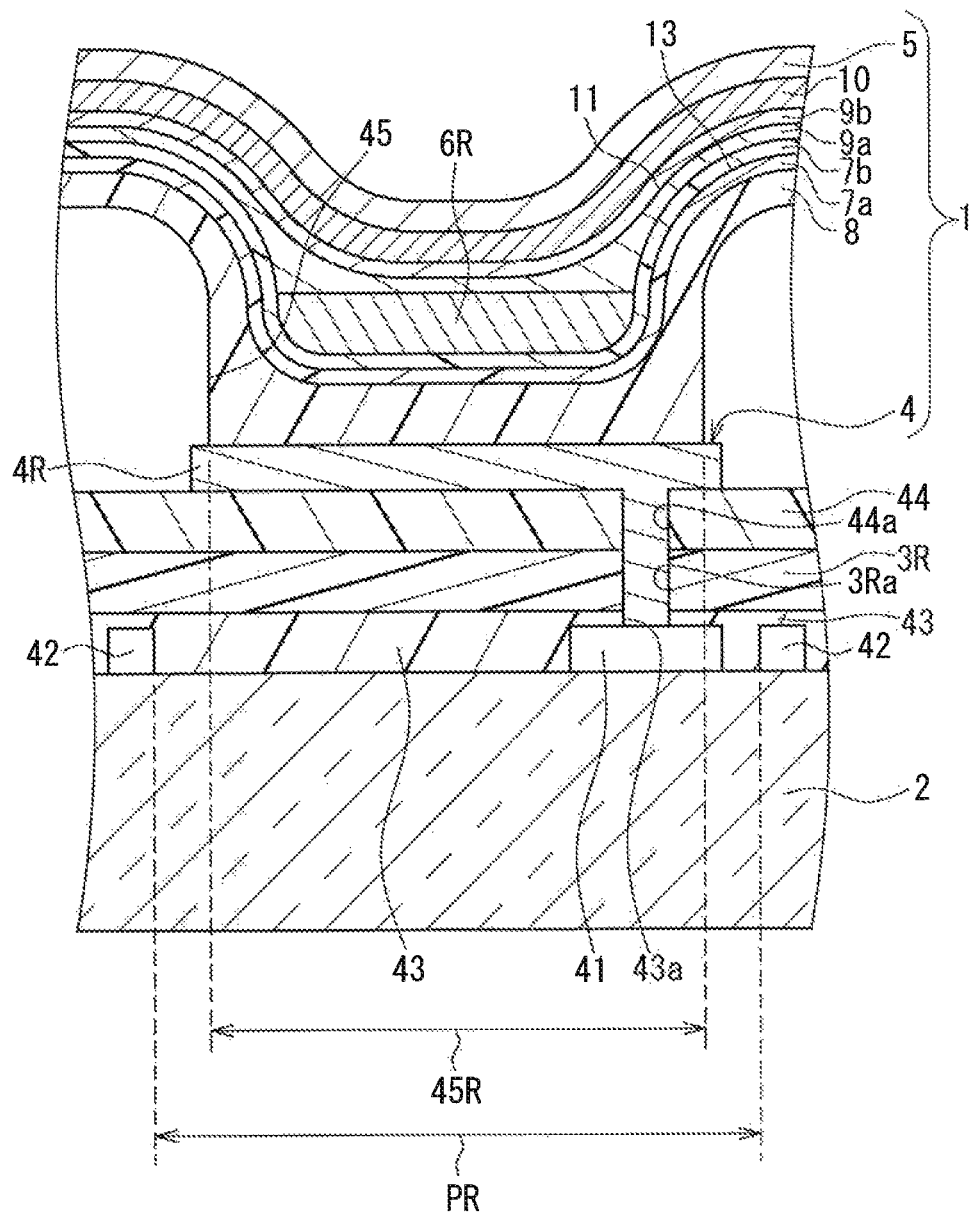
FIG. 20 is a cross-sectional view showing a specific configuration example of the organic EL element shown in FIG. 18 when it is applied to an active matrix organic EL display device.
Figure 21:
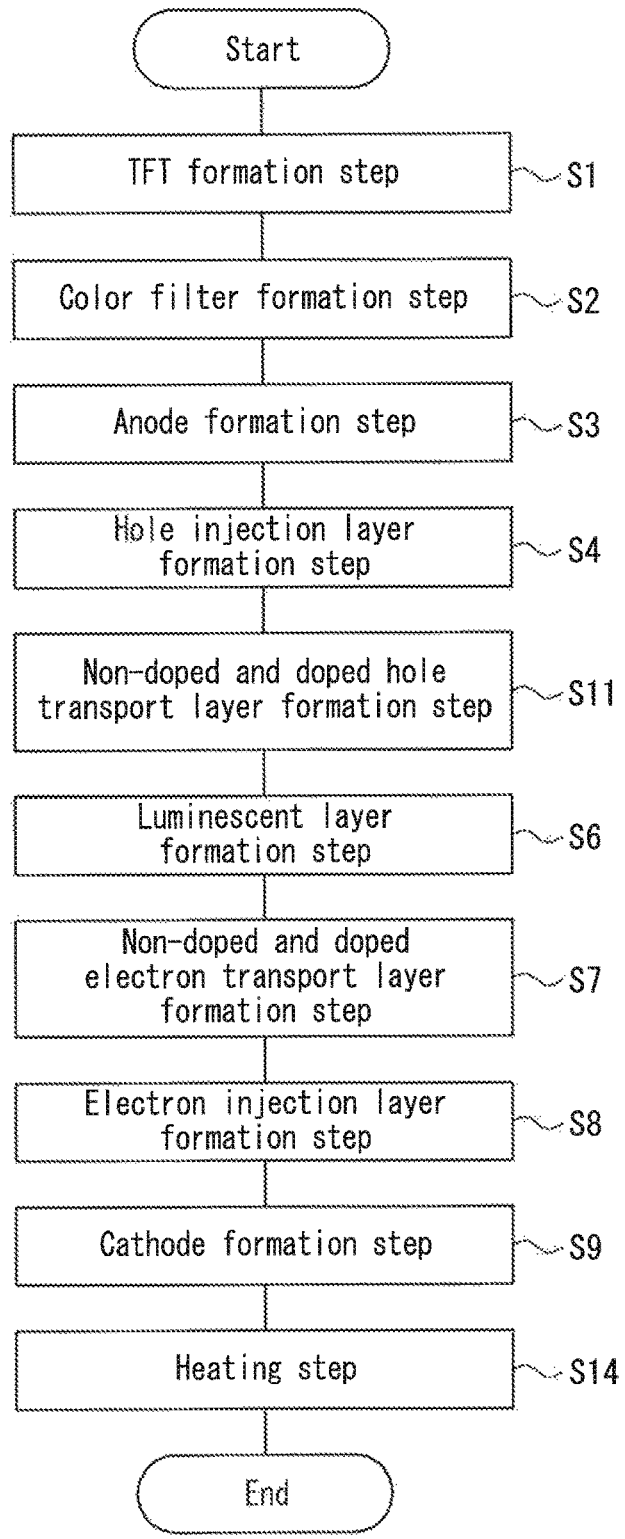
FIG. 21 is a flowchart illustrating the production steps of the organic EL element shown in FIG. 20.

FIG. 18 is a cross-sectional view showing the configuration of an organic EL element according to Embodiment 5 of the present invention. FIG. 19 is a view illustrating of the action of the organic EL element shown in FIG. 18. FIG. 20 is a cross-sectional view showing a specific configuration example of the organic EL element shown in FIG. 18 when it is applied to an active matrix organic EL display device. FIG. 21 is a flowchart illustrating the production steps of the organic EL element shown in FIG. 20.

In the drawings, this embodiment is mainly different from Embodiment 1 in that a doped hole transport layer to which a p-type dopant material is added and a non-doped hole transport layer to which a p-type dopant material is not added are provided as a hole transport layer, and a second reflection surface is provided at an interface between the doped hole transport layer and the non-doped hole transport layer. Here, components in common with those in Embodiment 1 are assigned with the same reference numbers, and a duplicated explanation is omitted.

In FIG. 18, in the organic EL element 1 of this embodiment, the electron transport layer 9 includes the non-doped electron transport layer 9a to which an n-type dopant material is not added and the doped electron transport layer 9b to which an n-type dopant material is added. Further, the first reflection surface 11 is provided at an interface between the non-doped electron transport layer 9a and the doped electron transport layer 9b to which an n-type dopant material is added, as a reflection surface to reflect light from the luminescent layer 6.

In the organic EL element 1 of this embodiment, the hole transport layer 7 includes the doped hole transport layer 7a to which a p-type dopant material is added and the non-doped hole transport layer 7b to which a p-type dopant material is not added. Further, the second reflection surface 13 is provided at an interface between the non-doped hole transport layer 7b and the doped hole transport layer 7a to which a p-type dopant material is added, as a reflection surface to reflect light from the luminescent layer 6.

Further, as shown in FIG. 19, in the organic EL element 1 of this embodiment, part of light from the luminescent layer 6 passes through the first reflection surface 11, and is reflected to the anode 4 side at an interface between the cathode 5 and the electron injection layer 10 as indicated by an arrow A on the left side in FIG. 19. Then, the light is reflected to the cathode 5 side at the second reflection surface 13, reflected again to the anode 4 side at the interface between the cathode 5 and the electron injection layer 10, and emitted to the outside.

Further, as indicated by an arrow A on the right side in FIG. 19, part of light from the luminescent layer 6 is reflected to the anode 4 side at the second reflection surface 13 and emitted to the outside. This light can have the same peak as that indicated by the arrow A on the left side in FIG. 19. In this case, the brightness of the light having this peak is increased, and the luminescent quality of the organic EL element 1 is increased accordingly.

Further, as indicated by an arrow B on the left side in FIG. 19, part of light from the luminescent layer 6 passes through the first reflection surface 11, is reflected to the anode 4 side at the interface between the cathode 5 and the electron injection layer 10, passes through the second reflection surface 13, and is emitted to the outside.

Further, as indicated by an arrow B on the right side in FIG. 19, part of light from the luminescent layer 6 passes through the first reflection surface 11, is reflected to the anode 4 side at the interface between the cathode 5 and the electron injection layer 10, and emitted to the outside. This light can have the same peak as that indicated by the arrow B on the left side in FIG. 19. In this case, the brightness of the light having this peak is increased, and the luminescent quality of the organic EL element 1 is increased accordingly.

Other than the above description, for example, it is possible to emit light having four different peaks to the outside by changing the n-type and/or p-type dopant materials, changing the thickness of the electron transport layer 9 and the hole transport layer 7, etc.

When red sub-pixels of an active matrix organic EL display device are constituted using the organic EL element 1 of this embodiment, similarly to the organic EL element 1 of Embodiment 1, the TFT 41 (switching element), the wiring 42, the protective film 43, the red color filter 3R, the interlayer film 44 (interlayer insulating film, flattening film), the edge cover 45, and the like are provided on the substrate 2 as shown in FIG. 20.

Further, as shown in a step S11 in FIG. 21, after completion of the hole injection layer formation step, a non-doped and doped hole transport layer formation step of sequentially forming the doped hole transport layer 7a and the non-doped hole transport layer 7b on the hole injection layer 8 is performed.

Further, as shown in a step S7 in FIG. 21, after completion of the luminescent layer formation step, a non-doped and doped electron transport layer formation step of sequentially forming the non-doped electron transport layer 9a and the doped electron transport layer 9b on the luminescent layer 6 is performed.

Further, as shown in a step S14 in FIG. 21, a heating step of heating the organic EL element 1 is performed. Specifically, in this heating step, the organic EL element 1 is annealed at, e.g., 80° C. for one hour. Thus, the n-type dopant material added in the doped electron transport layer 9b can be gathered at the interface between the non-doped electron transport layer 9a and the doped electron transport layer 9b, and thereby the first reflection surface 11 that reflects light from the luminescent layer 6R is formed at the interface. At the same time, the p-type dopant material added in the doped hole transport layer 7a can be gathered at the interface between the doped hole transport layer 7a and the non-doped hole transport layer 7b, and thereby the second reflection surface 13 that reflects light from the luminescent layer 6R is formed at the interface.

With the above configuration, Embodiment 5 achieves effects similar to those of Embodiment 1 described above. Further, this embodiment can increase the luminescent quality of the organic EL element 1 by provision of the first reflection surface 11 and the second reflection surface 13.

Further, in this embodiment, since the cathode 5 is composed of a reflecting electrode and the light from the luminescent layer 6 is emitted from the anode 4 side to the outside, it is possible to configure the bottom emission type organic EL element 1 having a simple structure that is produced easily and that has an excellent luminescence property while emitting light having a plurality of peaks.

Embodiment 6

Figure 22:
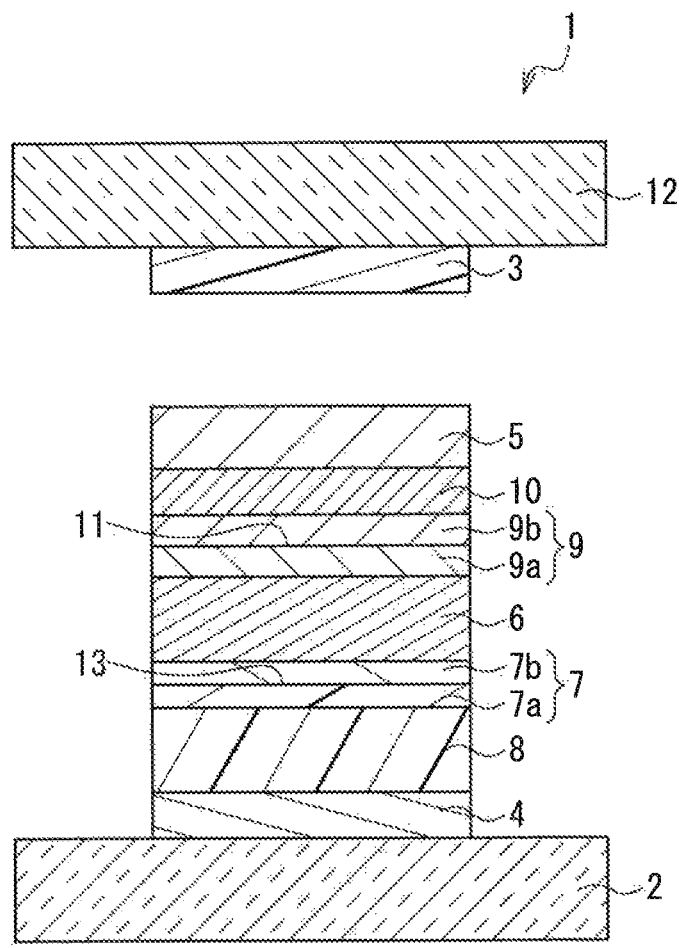
FIG. 22 is a cross-sectional view showing the configuration of an organic EL element according to Embodiment 6 of the present invention.
Figure 23:
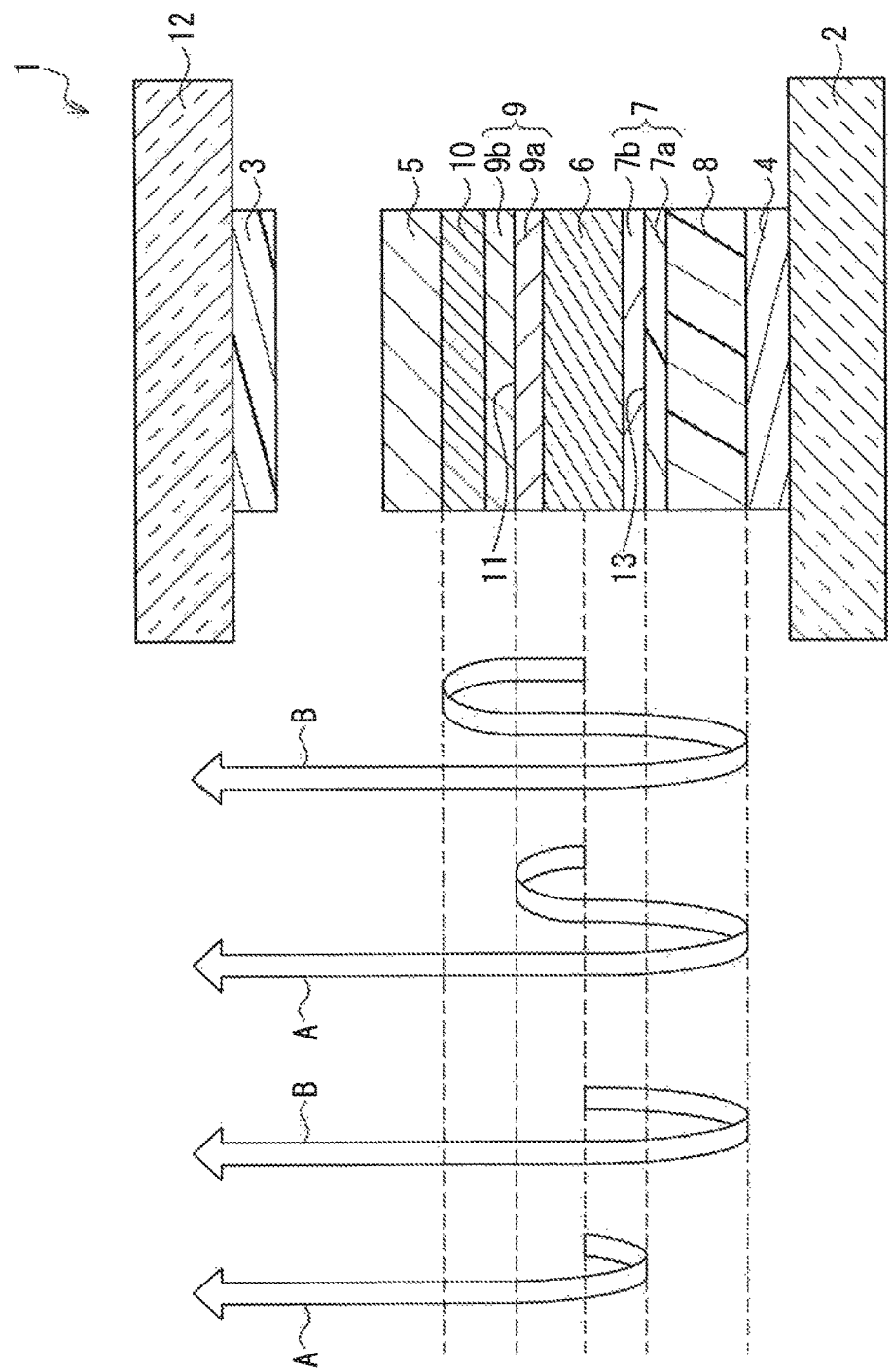
FIG. 23 is a view illustrating of the action of the organic EL element shown in FIG. 22.
Figure 24:
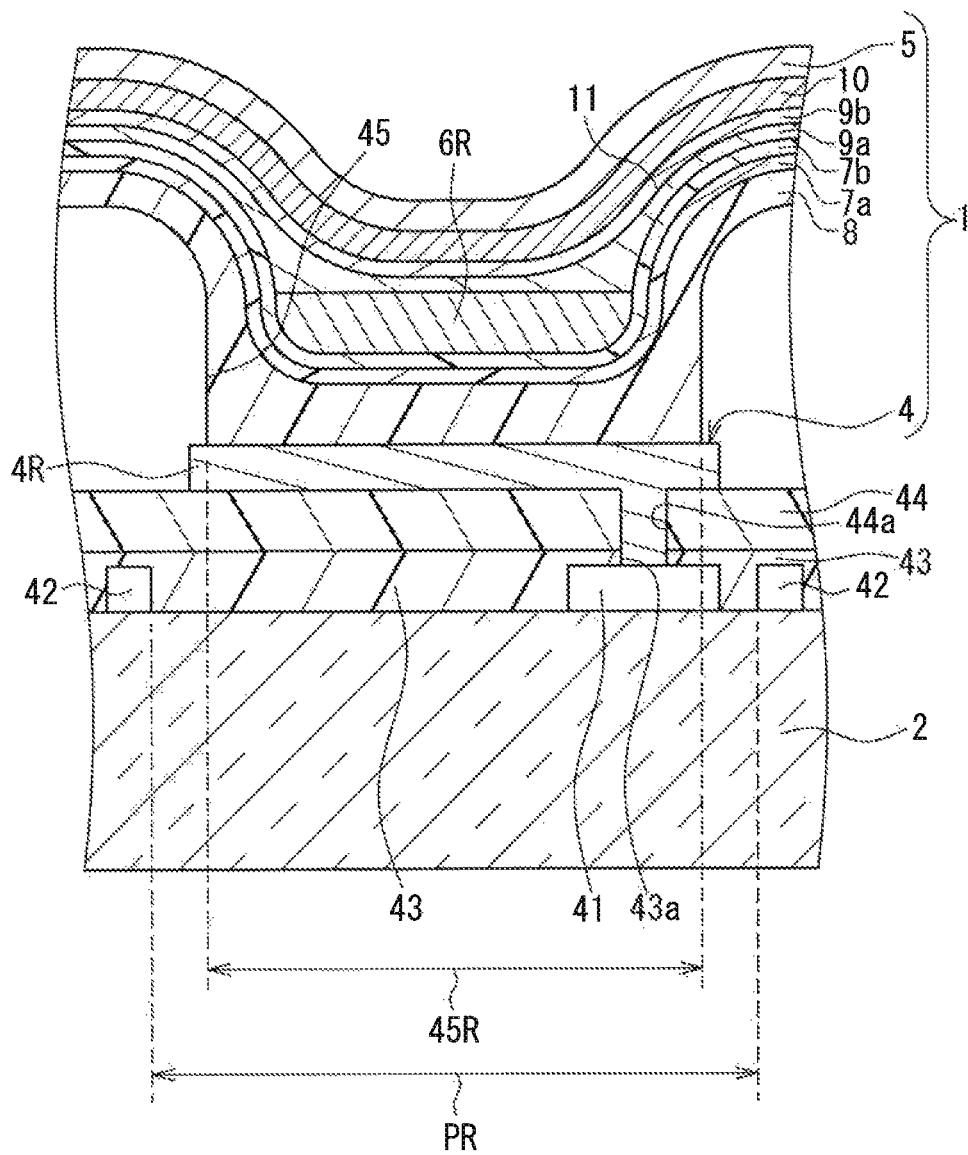
FIG. 24 is a cross-sectional view showing a specific configuration example of the organic EL element shown in FIG. 22 when it is applied to an active matrix organic EL display device.
Figure 25:
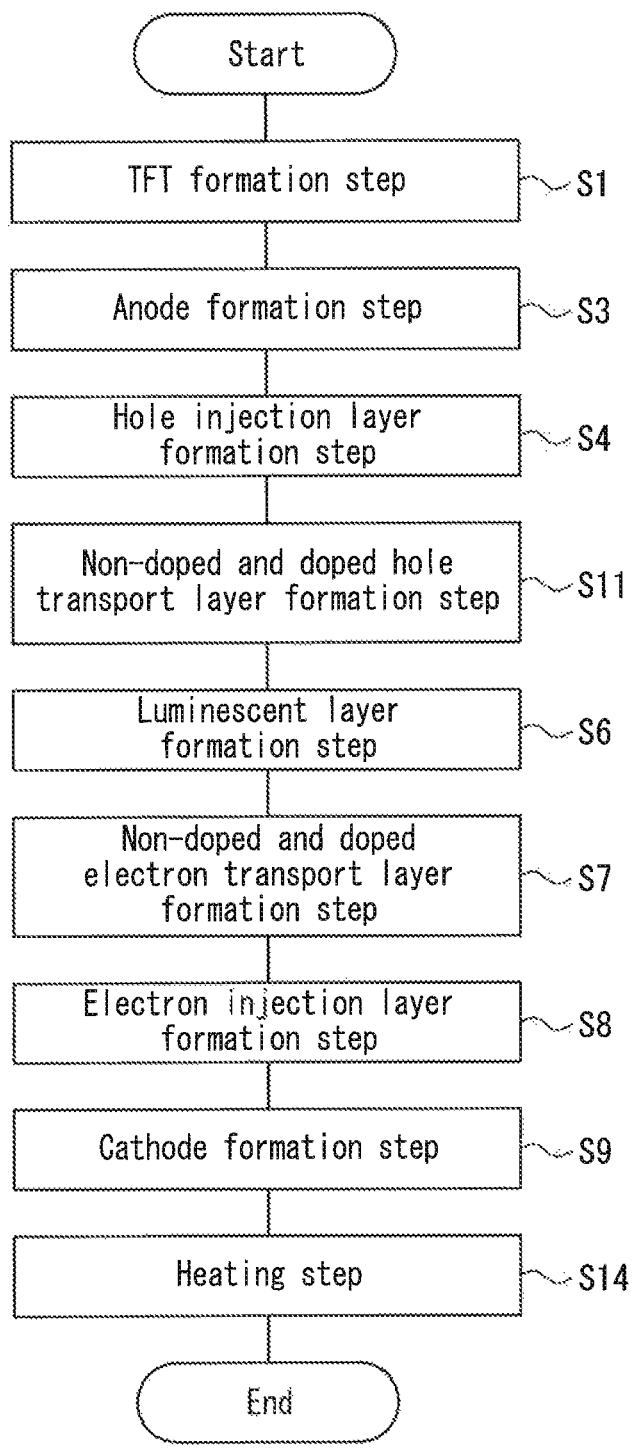
FIG. 25 is a flowchart illustrating the production steps of the organic EL element shown in FIG. 24.

FIG. 22 is a cross-sectional view showing the configuration of an organic EL element according to Embodiment 6 of the present invention. FIG. 23 is a view illustrating of the action of the organic EL element shown in FIG. 22. FIG. 24 is a cross-sectional view showing a specific configuration example of the organic EL element shown in FIG. 22 when it is applied to an active matrix organic EL display device. FIG. 25 is a flowchart illustrating the production steps of the organic EL element shown in FIG. 24.

In the drawings, this embodiment is mainly different from Embodiment 5 in that a top emission type organic EL element that emits light from the luminescent layer from the cathode side is configured. Here, components in common with those in Embodiment 5 are assigned with the same reference numbers, and a duplicated explanation is omitted.

As shown in FIG. 22, the organic EL element 1 of this embodiment includes the anode 4, the hole injection layer 8, the hole transport layer 7, the luminescent layer 6, the electron transport layer 9, the electron injection layer 10, and the cathode 5 that are formed on the substrate 2 in this order. The organic EL element 1 of this embodiment further includes a counter substrate 12 provided opposite to the substrate 2, and the color filter 3 provided on the counter substrate 12 on the substrate 2 side.

In the organic EL element 1 of this embodiment, the anode 4 is composed of a reflecting electrode. The organic EL element 1 of this embodiment is a top emission type that emits light from the luminescent layer 6 from the cathode 5 (the counter substrate 12) side to the outside.

Further, as shown in FIG. 23, in the organic EL element 1 of this embodiment, part of light from the luminescent layer 6 is reflected to the cathode 5 side at the second reflection surface 13 and emitted to the outside as indicated by an arrow A on the left side in FIG. 23.

Further, as indicated by an arrow A on the right side in FIG. 23, part of light from the luminescent layer 6 is reflected to the anode 4 side at the first reflection surface 11, and is reflected to the cathode 5 side at an interface between the anode 4 and the hole injection layer 8. Then, the light passes through the first reflection surface 11, and is emitted to the outside. This light can have the same peak as that indicated by the arrow A on the left side in FIG. 23. In this case, the brightness of the light having this peak is increased, and the luminescent quality of the organic EL element 1 is increased accordingly.

Further, as indicated by an arrow B on the left side in FIG. 23, part of light from the luminescent layer 6 passes through the second reflection surface 13, is reflected to the cathode 5 side at the interface between the anode 4 and the hole injection layer 8, and emitted to the outside.

Further, as indicated by an arrow B on the right side in FIG. 23, part of light from the luminescent layer 6 passes through the first reflection surface 11, and is reflected to the anode 4 side at an interface between the cathode 5 and the electron injection layer 10. Then, the light is reflected to the cathode 5 side at the interface between the anode 4 and the hole injection layer 8 and emitted to the outside. This light can have the same peak as that indicated by the arrow B on the left side in FIG. 23. In this case, the brightness of the light having this peak is increased, and the luminescent quality of the organic EL element 1 is increased accordingly.

Other than the above description, for example, it is possible to emit light having four different peaks to the outside by changing the n-type and/or p-type dopant materials, changing the thickness of the electron transport layer 9 and the hole transport layer 7, etc.

When red sub-pixels of an active matrix organic EL display device are constituted using the organic EL element 1 of this embodiment, similarly to the organic EL element 1 of Embodiment 3, the TFT 41 (switching element), the wiring 42, the protective film 43, the interlayer film 44 (interlayer insulating film, flattening film), the edge cover 45, and the like are provided on the substrate 2 as shown in FIG. 24. Unlike the organic EL element 1 of Embodiment 5, the red color filter 3R is not provided on the substrate 2.

Further, as shown in steps S1, S3, S4, S11, S6-S9 and S14 in FIG. 25, in the organic EL element 1 of this embodiment, the respective constituent elements on the substrate 2 side are formed in the same manner as in Embodiment 5. Meanwhile, on the counter substrate 12 side, the color filter formation step shown in the step S2 in FIG. 21 is performed so as to form the color filter 3 on the counter substrate 12. Thereafter, the substrate 2 and the counter substrate 12 are adhered to each other. Thus, the organic EL element 1 of this embodiment is produced.

With the above configuration, Embodiment 6 achieves effects similar to those of Embodiment 5 described above.

Further, in this embodiment, since the anode 4 is composed of a reflecting electrode and the light from the luminescent layer 6 is emitted from the cathode 5 side to the outside, it is possible to configure the top emission type organic EL element 1 having a simple structure that is produced easily and that has an excellent luminescence property while emitting light having a plurality of peaks.

Further, in this embodiment, since the top emission type organic EL element 1 is configured, it is possible to increase an aperture ratio as compared with that in Embodiment 5.

Further, in this embodiment, since the color filter 3 is provided on the counter substrate 12 side, the step of forming the color filter 3 can be simplified as compared with that in Embodiment 5. Thus, the manufacturing yield is improved easily.

The above embodiments are merely illustrative and not limiting. The technical scope of the present invention is specified by the scope of the claims, and any modification falling in the scope of the configuration described therein and equivalent thereto also fall in the technical scope of the present invention.

For example, the foregoing description refers to a case where the present invention is applied to an organic EL element having a red luminescent layer. However, the present invention is not limited as long as: one of the anode and the cathode is composed of a reflecting electrode; at least one of the hole transport layer and the electron transport layer is composed of a doped layer to which a dopant material is added and a non-doped layer to which a dopant material is not added; and a reflection surface that reflects light from the luminescent layer is provided at an interface between the doped layer and the non-doped layer. Specifically, the present invention can be applied to an organic EL element having a luminescent layer that emits light of e.g., green color, blue color or white color.

Figure 26:
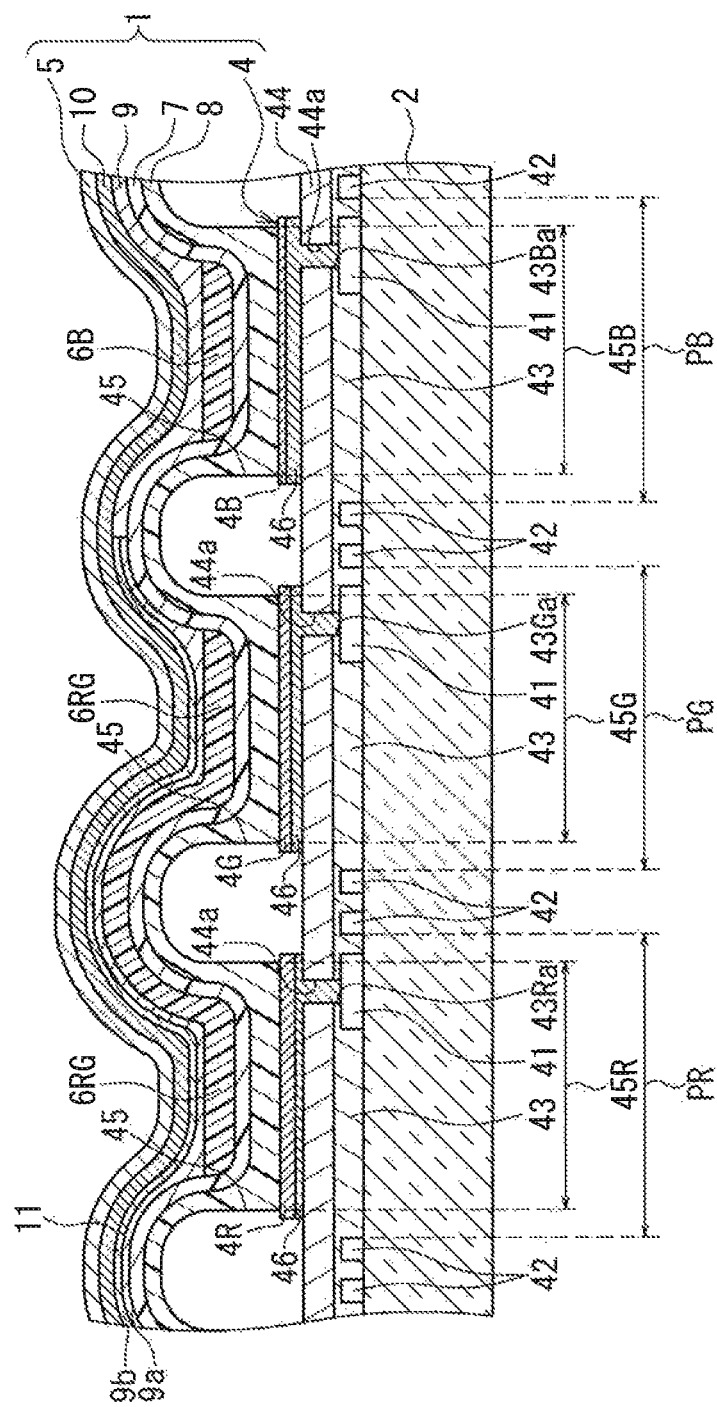
FIG. 26 is a cross-sectional view showing a specific configuration example of an organic EL element of the present invention when it is applied to an active matrix organic EL display device.

Specifically, as exemplified in FIG. 26, it is possible to configure an organic EL element to be mounted in an active matrix organic EL display device that has sub-pixels PR, PG, and PB of red color, green color, and blue color.

In FIG. 26, the TFT 41 (switching element), the wiring 42, the protective film 43, the interlayer film 44 (interlayer insulating film, flattening film), the edge cover 45, and the like are provided on the substrate 2. Further, a counter substrate is provided opposite to the substrate 2 (not illustrated). A color filter layer that includes color filters corresponding to the respective colors of the sub-pixels PR, PG, and PB is provided on the counter substrate.

The TFT 41 functions as a switching element to control the luminescence of each of the sub-pixels PR, PG, and PB, and provided in each of the sub-pixels PR, PG, and PB. The TFT 41 is connected to the wiring 42.

The protective film 43 is composed of, e.g., a nitride film or an oxide film, and provided on the TFT 41 and the wiring 42 to protect the TFT 41 and the wiring 42.

The interlayer film 44 is composed of e.g., an organic film. The interlayer film 44 also functions as a flattening film, and is stacked on the color filter 3.

On the interlayer film 44, a reflecting electrode 46 is formed in each of the sub-pixels PR, PG, and PB. On the reflecting electrode 46, an anode 4R for red color, an anode 4G for green color, and an anode 4B for blue color are formed respectively in the sub-pixels PR, PG, and PB. The anode 4R is electrically connected to the TFT 41 via a contact hole 44a formed in the reflecting electrode 46 and the interlayer film 44, and a contact hole 43a formed in the protective film 43. Similarly, the anode 4G is electrically connected to the TFT 41 via the contact hole 44a formed in the reflecting electrode 46 and the interlayer film 44, and the contact hole 43a formed in the protective film 43. Similarly, the anode 4B is electrically connected to the TFT 41 via the contact hole 44a formed in the reflecting electrode 46 and the interlayer film 44, and the contact hole 43a formed in the protective film 43.

The reflecting electrode 46 is made of a metal having high optical reflectance such as aluminum (Al) or silver (Ag). The reflecting electrode 46 reflects light emitted from luminescent layers (described below) toward the cathode 5 side.

As the material of the anodes 4R, 4G, and 4B, for example, a transparent conducting film of indium tin oxide (hereinafter, simply referred to as ITO) is used.

The edge cover 45 is formed on the interlayer film 44 so as to cover a pattern end of the anode 4. The edge cover 45 is an insulating layer to prevent short circuit of the anode 4 and the cathode 5 constituting the organic EL element 1, which occurs at the pattern end of the anode 4 due to the thinned organic EL layer between the anode 4 and the cathode 5, concentration of the electric field, etc.

In the edge cover 45, an opening 45R, 45G, or 45B is provided per sub-pixel PR, PG, or PB. The openings 45R, 45G, and 45B of the edge cover 45 are luminescent regions of the sub-pixels PR, PG, and PB. In other words, the sub-pixels PR, PG, and PB are partitioned by the insulative edge cover 45. The edge cover 45 also functions as an element isolation film.

In an example shown in FIG. 26, a luminescent layer 6RG of red and green colors is integrally deposited using the same mask, and a luminescent layer 6B of blue color is deposited using a different mask. The luminescent layer 6RG of red and green colors is made of a luminescent material that can emit light of a red wavelength region and light of a green wavelength region. At the sub-pixel PR, red light among light from the luminescent layer 6RG is emitted to the outside through a red color filter (not illustrated) provided on the counter substrate side. At the sub-pixel PG, green light among light from the luminescent layer 6RG is emitted to the outside through a green color filter (not illustrated) provided on the counter substrate side.

Moreover, in the sub-pixels PR and PG, the first reflection surface 11 is formed at an interface between the non-doped electron transport layer 9a and the doped electron transport layer 9b. Thus, in each of the sub-pixels PR and PG, it is possible to emit light having two peaks (wavelengths) to the outside as exemplified by the solid line in FIG. 5.

A microcavity structure is used in this organic EL element. In the organic EL element, for example, a total layer thickness (optical path length) between the reflecting electrode 46 and the cathode 5 in the red sub-pixel PR is different from a total layer thickness (optical path length) between the reflecting electrode 46 and the cathode 5 in the green sub-pixel PG. Specifically, the layer thickness of the anode 4R of the red sub-pixel PR and the layer thickness of the anode 4G of the green sub-pixel PG are reduced sequentially. Thus, red light among light from the luminescent layer 6RG is intensified in the red sub-pixel PR and emitted, and green light among light from the luminescent layer 6RG is intensified in the green sub-pixel PG and emitted.

In the sub-pixels PR and PG, the electron transport layer 9 includes the non-doped electron transport layer 9a and the doped electron transport layer 9b that are formed using the same mask. In the sub-pixel PB, the electron transport layer 9 includes only the electron transport layer 9 that is formed using a different mask.

As described above, since it is unnecessary to deposit and form layers using different masks for RGB, the positioning accuracy of RGB is improved easily.

Figure 27:
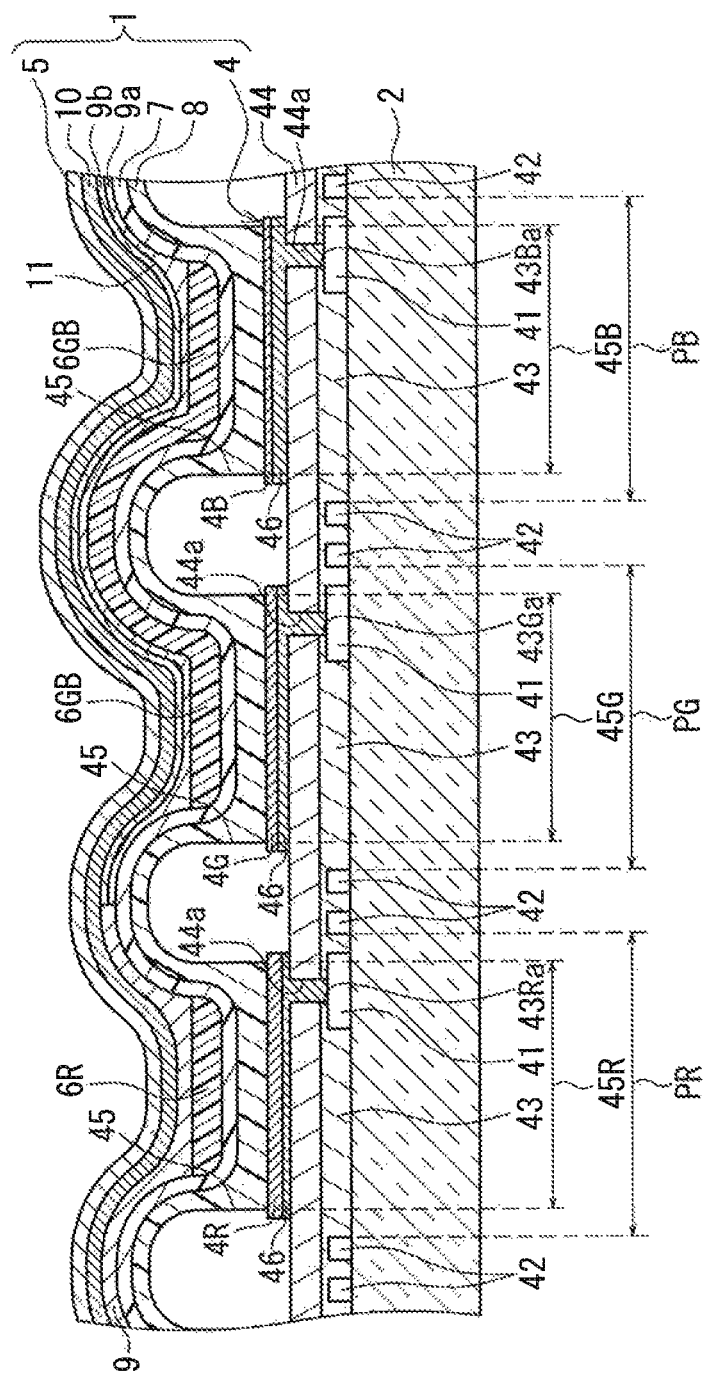
FIG. 27 is a cross-sectional view showing a specific configuration example of an organic EL element of the present invention when it is applied to an active matrix organic EL display device.

Other than the above description, as exemplified in FIG. 27, a luminescent layer 6GB of green and blue colors is integrally deposited using the same mask, and a luminescent layer 6R of red color is deposited using a different mask. The luminescent layer 6GB of green and blue colors is made of a luminescent material that can emit light of a green wavelength region and light of a blue wavelength region. At the sub-pixel PG, green light among light from the luminescent layer 6GB is emitted to the outside through a green color filter (not illustrated) provided on the counter substrate side. At the sub-pixel PB, blue light among light from the luminescent layer 6GB is emitted to the outside through a blue color filter (not illustrated) provided on the counter substrate side.

Moreover, in the sub-pixels PG and PB, the first reflection surface 11 is formed at an interface between the non-doped electron transport layer 9a and the doped electron transport layer 9b. Thus, in each of the sub-pixels PG and PB, it is possible to emit light having two peaks (wavelengths) to the outside as exemplified by the solid line in FIG. 5.

Also in an example shown in FIG. 27, similarly to the configuration shown in FIG. 26, the layer thickness of the anode 4G of the green sub-pixel PG and the layer thickness of the anode 4B of the blue sub-pixel PB are reduced sequentially. Thus, green light among light from the luminescent layer 6GB is intensified in the green sub-pixel PG and emitted, and blue light among light from the luminescent layer 6GB is intensified in the blue sub-pixel PB and emitted.

In the sub-pixels PG and PB, the electron transport layer 9 includes the non-doped electron transport layer 9a and the doped electron transport layer 9b that are formed using the same mask. In the sub-pixel PR, the electron transport layer 9 includes only the electron transport layer 9 that is formed using a different mask.

Other than the examples shown in FIGS. 26 and 27, such a configuration can be applied to, e.g., a bottom emission type shown in Embodiment 1. Further, the sub-pixels PR and PG or the sub-pixels PG and PB may be configured to include a common luminescent layer 6RG or 6GB as well as doped and non-doped hole transport layers and a second reflection surface as exemplified in Embodiments 3 and 4. Alternatively, the sub-pixels PR and PG or the sub-pixels PG and PB may be configured to include a common luminescent layer 6RG or 6GB as well as doped and non-doped electron transport layers, doped and non-doped hole transport layers, and first and second reflection surfaces as exemplified in Embodiments 5 and 6.

As described above, in the present invention, the configuration is not limited as long as: luminescent layers of a plurality of colors are formed; among the luminescent layers of a plurality of colors, adjacent luminescent layers of different colors are formed integrally; and in at least one of the hole transport layer and the electron transport layer, a doped layer to which a dopant material is added and a non-doped layer to which a dopant material is not added are formed correspondingly to the integrally formed adjacent luminescent layers of different colors.

Specifically, when the configuration is applied to the above Embodiments 1 and 2, a step of forming luminescent layers of a plurality of colors is performed. In the step of forming luminescent layers of a plurality of colors, adjacent luminescent layers of different colors are formed integrally. In the step of forming the non-doped electron transport layer and the doped electron transport layer, the non-doped electron transport layer and the doped electron transport layer are formed correspondingly to the integrally formed adjacent luminescent layers of different colors. Thus, the adjacent luminescent layers of different colors can be formed using the same mask, and in the electron transport layer, the doped layer and the non-doped layer are formed using the same mask (it may be a mask different from that for the adjacent luminescent layers of different colors). As a result, in the luminescent layer and the electron transport layer, the positioning accuracy of RGB is improved easily.

Further, when the configuration is applied to the above Embodiments 3 and 4, a step of forming luminescent layers of a plurality of colors is performed. In the step of forming luminescent layers of a plurality of colors, adjacent luminescent layers of different colors are formed integrally. In the step of forming the non-doped hole transport layer and the doped hole transport layer, the non-doped hole transport layer and the doped hole transport layer are formed correspondingly to the integrally formed adjacent luminescent layers of different colors. Thus, the adjacent luminescent layers of different colors can be formed using the same mask, and in the hole transport layer, the doped layer and the non-doped layer are formed using the same mask (it may be a mask different from that for the adjacent luminescent layers of different colors). As a result, in the luminescent layer and the hole transport layer, the positioning accuracy of RGB is improved easily.

Further, when the configuration is applied to the above Embodiments 5 and 6, a step of forming luminescent layers of a plurality of colors is performed. In the step of forming luminescent layers of a plurality of colors, adjacent luminescent layers of different colors are formed integrally. In the step of forming the non-doped hole transport layer and the doped hole transport layer and in the step of forming the non-doped electron transport layer and the doped electron transport layer, the non-doped hole transport layer and the doped hole transport layer, and the non-doped electron transport layer and the doped electron transport layer are formed correspondingly to the integrally formed adjacent luminescent layers of different colors. Thus, the adjacent luminescent layers of different colors can be formed using the same mask, and in the hole transport layer and the electron transport layer, the doped layer and the non-doped layer are formed using the same mask (it may be a mask different from that for the adjacent luminescent layers of different colors). As a result, in the luminescent layer, the hole transport layer, and the electron transport layer, the positioning accuracy of RGB is improved easily.

Further, the foregoing description refers to a case where the doped electron transport layer or the doped hole transport layer is formed by a codeposition method using the host material and dopant material. The present invention is not limited to this, and for example, the doped and non-doped electron transport layers or the doped and non-doped hole transport layers may be formed by firstly forming an electron transport layer or a hole transport layer by a vacuum deposition method, and doping the electron transport layer or the hole transport layer with a corresponding dopant material.

However, in terms of easy formation of the doped electron transport layer or the doped hole transport layer, it is preferred that the doped electron transport layer or the doped hole transport layer be formed by a codeposition method using the host material and dopant material, as in the above embodiments.

Further, the foregoing description refers to a configuration in which the color filter is provided on the anode or cathode side of the luminescent layer. The present invention is not limited to this. The present invention can be applied to an organic EL element not provided with color filters. In such a case where color filters are not provided, it is possible to emit light having at least two peaks as described above.

However, the configuration with color filters as in the above embodiments is preferred because color filters can adjust the wavelength region of light emitted to the outside.

The foregoing Embodiments 1-6 explain a configuration in which the luminescent layer, the hole transport layer, and the electron transport layer are provided separately. The organic EL element of the present invention is not limited to this, and for example, a luminescent layer that also serves as a hole transport layer or a luminescent layer that also serves as an electron transport layer may be used instead.

Further, the presence or absence of the reflection surface can be judged by performing elementary analysis in the film thickness direction using, e.g., secondary ion mass spectrometry (SIMS), based on whether or not a certain interface contains a large amount of a dopant material (cesium carbonate, molybdenum, etc.).

Further, it is considered that, when adjacent luminescent layers of different colors and the electron transport layer or the hole transport layer are formed integrally as shown in FIGS. 26 and 27, since different colors are extracted from the luminescent layer of the same color, a reflection surface is formed at an interface between the two layers of the electron transport layer or the hole transport layer.

INDUSTRIAL APPLICABILITY

The present invention is useful for an organic EL element having a simple structure that is produced easily and that has an excellent luminescence property while emitting light having a plurality of peaks, and a method for producing the same.

DESCRIPTION OF REFERENCE NUMERALS 1 organic EL element
3 color filter
4 anode
5 cathode
6 luminescent layer
7 hole transport layer
7a doped hole transport layer
7b non-doped hole transport layer
9 electron transport layer
9a non-doped electron transport layer
9b doped electron transport layer
11 first reflection surface
13 second reflection surface

The invention claimed is:
1. An organic EL element comprising:
an anode,
a cathode,
a luminescent layer provided between the anode and the cathode,
a hole transport layer provided between the anode and the luminescent layer, and
an electron transport layer provided between the cathode and the luminescent layer, wherein
one of the anode and the cathode is composed of a reflecting electrode, at least one of the hole transport layer and the electron transport layer is composed of a doped layer to which a dopant material is added and a non-doped layer to which a dopant material is not added,
a reflection surface that reflects light from the luminescent layer is provided at an interface between the doped layer and the non-doped layer,
the luminescent layer is composed of luminescent layers of a plurality of colors,
among the luminescent layers of a plurality of colors, adjacent luminescent layers of different colors are formed integrally, and
in at least one of the hole transport layer and the electron transport layer, a doped layer to which a dopant material is added and a non-doped layer to which a dopant material is not added are formed correspondingly to the integrally formed adjacent luminescent layers of different colors.

2. The organic EL element according to claim 1, wherein the electron transport layer is composed of a doped electron transport layer to which an n-type dopant material is added and a non-doped electron transport layer to which an n-type dopant material is not added, and
a first reflection surface as the reflection surface is provided at an interface between the doped electron transport layer and the non-doped electron transport layer.

3. The organic EL element according to claim 1, wherein the hole transport layer is composed of a doped hole transport layer to which a p-type dopant material is added and a non-doped hole transport layer to which a p-type dopant material is not added, and
a second reflection surface as the reflection surface is provided at an interface between the doped hole transport layer and the non-doped hole transport layer.

4. The organic EL element according to claim 1, wherein the cathode is composed of a reflecting electrode, and
light from the luminescent layer is emitted from the anode side to the outside.

5. The organic EL element according to claim 1, wherein the anode is composed of a reflecting electrode, and
light from the luminescent layer is emitted from the cathode side to the outside.

6. A method for producing the organic EL element of claim 1, the method comprising:
forming a non-doped electron transport layer to which an n-type dopant material is not added and a doped electron transport layer to which an n-type dopant material is added, as the electron transport layer;
heating the organic EL element; and
forming a non-doped hole transport layer to which a p-type dopant material is not added and a doped hole transport layer to which a p-type dopant material is added, as the hole transport layer.

7. The method for producing an organic EL element according to claim 6, wherein, in the heating of the organic EL element, a reflection surface that reflects light from the luminescent layer is formed at an interface between the non-doped electron transport layer and the doped electron transport layer.

8. The method for producing an organic EL element according to claim 6, further comprising forming luminescent layers of a plurality of colors,
wherein, in the formation of luminescent layers of a plurality of colors, adjacent luminescent layers of different colors are formed integrally, and
in the formation of the non-doped electron transport layer and the doped electron transport layer, the non-doped electron transport layer and the doped electron transport layer are formed correspondingly to the integrally formed adjacent luminescent layers of different colors.

9. The method for producing an organic EL element according to claim 6,
wherein, in the heating of the organic EL element, a first reflection surface that reflects light from the luminescent layer is formed at an interface between the non-doped electron transport layer and the doped electron transport layer, and
a second reflection surface that reflects light from the luminescent layer is formed at an interface between the non-doped hole transport layer and the doped hole transport layer.

10. The method for producing an organic EL element according to claim 6, further comprising forming luminescent layers of a plurality of colors,
wherein, in the formation of luminescent layers of a plurality of colors, adjacent luminescent layers of different colors are formed integrally, and
in the formation of the non-doped hole transport layer and the doped hole transport layer and in the formation of the non-doped electron transport layer and the doped electron transport layer, the non-doped hole transport layer and the doped hole transport layer, and the non-doped electron transport layer and the doped electron transport layer are formed correspondingly to the integrally formed adjacent luminescent layers of different colors.

11. A method for producing the organic EL element of claim 1, the method comprising:
forming a non-doped hole transport layer to which a p-type dopant material is not added and a doped hole transport layer to which a p-type dopant material is added, as the hole transport layer; and
heating the organic EL element.

12. The method for producing an organic EL element according to claim 11, wherein, in the heating of the organic EL element, a reflection surface that reflects light from the luminescent layer is formed at an interface between the non-doped hole transport layer and the doped hole transport layer.

13. The method for producing an organic EL element according to claim 11, further comprising forming luminescent layers of a plurality of colors,
wherein, in the formation of luminescent layers of a plurality of colors, adjacent luminescent layers of different colors are formed integrally, and
in the formation of the non-doped hole transport layer and the doped hole transport layer, the non-doped hole transport layer and the doped hole transport layer are formed correspondingly to the integrally formed adjacent luminescent layers of different colors.

14. An organic EL element comprising:
an anode,
a cathode,
a luminescent layer provided between the anode and the cathode,
a hole transport layer provided between the anode and the luminescent layer, and
an electron transport layer provided between the cathode and the luminescent layer, wherein one of the anode and the cathode is composed of a reflecting electrode, at least one of the hole transport layer and the electron transport layer is composed of a doped layer to which a dopant material is added and a non-doped layer to which a dopant material is not added, a reflection surface that reflects light from the luminescent layer is provided at an interface between the doped layer and the non-doped layer, the hole transport layer is composed of a doped hole transport layer to which a p-type dopant material is added and a non-doped hole transport layer to which a p-type dopant material is not added, and a second reflection surface as the reflection surface is provided at an interface between the doped hole transport layer and the non-doped hole transport layer.

15. The organic EL element according to claim 14, wherein the cathode is composed of a reflecting electrode, and light from the luminescent layer is emitted from the anode side to the outside.

16. The organic EL element according to claim 14, wherein the anode is composed of a reflecting electrode, and light from the luminescent layer is emitted from the cathode side to the outside.

* * * * *